United States Patent
Zhang et al.

(10) Patent No.: US 11,817,161 B2
(45) Date of Patent: Nov. 14, 2023

(54) SHIFT REGISTER, DRIVE METHOD, DRIVE CIRCUIT, DISPLAY SUBSTRATE, AND DEVICE

(71) Applicants: Chengdu BOE Optoelectronics Technology Co., Ltd., Sichuan (CN); BOE Technology Group Co., Ltd., Beijing (CN)

(72) Inventors: Jingwen Zhang, Beijing (CN); Jianwu Hao, Beijing (CN); Gen Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 148 days.

(21) Appl. No.: 17/431,436

(22) PCT Filed: Feb. 19, 2021

(86) PCT No.: PCT/CN2021/076896
§ 371 (c)(1),
(2) Date: Aug. 17, 2021

(87) PCT Pub. No.: WO2021/227590
PCT Pub. Date: Nov. 18, 2021

(65) Prior Publication Data
US 2022/0310184 A1    Sep. 29, 2022

(30) Foreign Application Priority Data
May 11, 2020   (CN) .......................... 202010391404.3

(51) Int. Cl.
*G06F 3/038*      (2013.01)
*G11C 19/18*      (2006.01)
(Continued)

(52) U.S. Cl.
CPC ......... *G11C 19/184* (2013.01); *G09G 3/3225* (2013.01); *G11C 19/188* (2013.01);
(Continued)

(58) Field of Classification Search
CPC ..... G11C 19/184; G11C 19/188; G11C 19/28; G09G 3/3225; G09G 2310/0286;
(Continued)

(56) References Cited

U.S. PATENT DOCUMENTS 11,087,668 B1 * 8/2021 Li ........................ G09G 3/3266
2006/0139251 A1 * 6/2006 Morosawa ........... G09G 3/3275
                                                                345/76
(Continued)

FOREIGN PATENT DOCUMENTS

CN         1588555 A       3/2005
CN       101783124 A       7/2010
(Continued)

OTHER PUBLICATIONS

International Search Report for PCT/CN2021/076896 dated May 17, 2021.
(Continued)

*Primary Examiner* — Thuy N Pardo
(74) *Attorney, Agent, or Firm* — Ling Wu; Stephen Yang; Ling and Yang Intellectual Property

(57) ABSTRACT

A shift register, a drive method, a drive circuit, a display substrate, and a display device are provided. The shift register includes an input unit, a first control unit, a second control unit, an output unit, and a voltage stabilizing unit. The input unit is configured to provide a signal of a signal input end to a first node and a signal of a first power supply end to a second node. The first control unit is configured to control a signal of a fourth node. The second control unit is configured to provide a signal of a second power supply end
(Continued)

to the first node. The output unit is configured to provide the signal of the first or the second power supply end to the output end. The voltage stabilizing unit is connected to the first node, fifth node, the output end, and the first power supply end.

17 Claims, 12 Drawing Sheets

(51) Int. Cl.
  *G09G 3/3225* (2016.01)
  *H01L 27/12* (2006.01)
(52) U.S. Cl.
  CPC ........ *H01L 27/124* (2013.01); *H01L 27/1225* (2013.01); *H01L 27/1255* (2013.01); *G09G 2310/0286* (2013.01); *G09G 2320/02* (2013.01); *G09G 2330/021* (2013.01)
(58) Field of Classification Search
  CPC ......... G09G 2320/02; G09G 2330/021; G09G 2230/00; G09G 2300/0408; G09G 2320/0219; G09G 2320/0223; G09G 3/3266; H01L 27/1225; H01L 27/124; H01L 27/1255; H01L 27/1214; H10K 59/12
  USPC ........................ 345/64, 68, 76, 212, 211, 214
  See application file for complete search history.

(56) References Cited

U.S. PATENT DOCUMENTS

| | | | |
|---|---|---|---|
| 2007/0236421 A1* | 10/2007 | Shin ..................... | G09G 3/3275 345/76 |
| 2012/0062545 A1 | 3/2012 | Kim | |
| 2012/0161820 A1 | 6/2012 | Koo et al. | |
| 2012/0188210 A1 | 7/2012 | Zhang et al. | |
| 2013/0169609 A1 | 7/2013 | Son et al. | |
| 2014/0064436 A1* | 3/2014 | Ma .......................... | G11C 19/28 377/64 |
| 2014/0140468 A1* | 5/2014 | Cheng .................... | G11C 19/28 377/68 |
| 2015/0243237 A1 | 8/2015 | Li et al. | |
| 2015/0279480 A1 | 10/2015 | Murakami et al. | |
| 2016/0189626 A1* | 6/2016 | Sun ........................ | G11C 19/28 377/64 |
| 2017/0287390 A1* | 10/2017 | Lee ....................... | G09G 3/3233 |
| 2017/0301407 A1 | 10/2017 | Ma | |
| 2018/0122305 A1* | 5/2018 | An ........................ | G09G 3/3275 |
| 2019/0073948 A1* | 3/2019 | Wang .................... | G09G 3/3225 |
| 2019/0130847 A1* | 5/2019 | Um ....................... | G09G 3/3266 |
| 2019/0189052 A1* | 6/2019 | Moon ....................... | G09G 3/20 |
| 2020/0202779 A1* | 6/2020 | Chang .................. | G09G 3/3233 |
| 2021/0174731 A1* | 6/2021 | Wang .................... | G09G 3/3266 |
| 2021/0193007 A1 | 6/2021 | Cheng et al. | |
| 2021/0200351 A1 | 7/2021 | Yang et al. | |
| 2021/0225253 A1* | 7/2021 | Li ........................... | G11C 19/28 |
| 2021/0366354 A1 | 11/2021 | Li et al. | |
| 2021/0384279 A1 | 12/2021 | Li et al. | |

FOREIGN PATENT DOCUMENTS

| | | |
|---|---|---|
| CN | 102651239 A | 8/2012 |
| CN | 103208251 A | 7/2013 |
| CN | 104900268 A | 9/2015 |
| CN | 105096808 A | 11/2015 |
| CN | 105609041 A | 5/2016 |
| CN | 106952625 A | 7/2017 |
| CN | 107492337 A | 12/2017 |
| CN | 110176215 A | 8/2019 |
| CN | 110190073 A | 8/2019 |
| CN | 209265989 U | 8/2019 |
| CN | 110459572 A | 11/2019 |
| CN | 110956919 A | 4/2020 |
| CN | 111243650 A | 6/2020 |
| CN | 210692046 U | 6/2020 |
| CN | 111508433 A | 8/2020 |
| CN | 111540313 A | 8/2020 |
| CN | 111554230 A | 8/2020 |
| CN | 111816691 A | 10/2020 |
| JP | 2013-140665 A | 7/2013 |

OTHER PUBLICATIONS

Office Action dated Feb. 1, 2021 for Chinese Patent Application No. 202010391404.3 and English Translation.
Decision to Grant dated Jun. 30, 2021 for Chinese Patent Application No. 202010391404.3 and English Translation.
Wei Liang, "Shift Registers and Arithmetic Applications", Electronic Technology & Software Engineering, pp. 81-82.

* cited by examiner

SHIFT REGISTER, DRIVE METHOD, DRIVE CIRCUIT, DISPLAY SUBSTRATE, AND DEVICE

CROSS-REFERENCE TO RELATED APPLICATIONS

The present application is a U.S. National Phase Entry of International Application PCT/CN2021/076896 having an international filing date of Feb. 19, 2021, which claims priority of Chinese Patent Application No. 202010391404.3, filed to the CNIPA on May 11, 2020 and entitled "Shift Register, Drive Method, Drive Circuit, Display Substrate, and Device", the disclosure of which should be interpreted as being hereby incorporated by reference.

TECHNICAL FIELD

Embodiments of the present disclosure relate to, but are not limited to, the technical field of display, and in particular to a shift register, a drive method, a drive circuit, a display substrate, and a display device.

BACKGROUND

A light-emitting drive circuit is an important auxiliary circuit in an Active Matrix Organic Light-Emitting Diode (AMOLED) display, which is essentially a shift register circuit. The purpose of the light-emitting drive circuit is to drive pixels in a display region row by row to emit light. In an ideal light-emitting drive circuit, an output signal is only shifted with respect to an input signal, but the shape of the output signal is consistent with that of the input signal.

The light-emitting drive circuit includes multiple cascaded shift registers, and an input of a first-stage shift register is an ideal pulse signal. In some cases, however, the output signal, in addition to being shifted with respect to the input signal, also produces pulse fluctuations of a certain amplitude in low level segments of output pulses. The pulse fluctuations reflect current fluctuations generated on a light-emitting current of the pixels, which adversely affect the display image quality.

SUMMARY

The following is a summary of the subject matter described in detail herein. The summary is not intended to limit the scope of protection of the claims.

In an aspect, an embodiment of the present disclosure provides a shift register, including: an input unit, a first control unit, a second control unit, an output unit, and a voltage stabilizing unit.

The input unit is respectively connected to a signal input end, a first power supply end, a first clock signal end, a first node, and a second node, and is configured to provide a signal of the signal input end to the first node and provide a signal of the first power supply end to the second node under control of the first clock signal end.

The first control unit is respectively connected to the first node, the second node, a fourth node, a second power supply end, and a second clock signal end, and is configured to control a signal of the fourth node according to the signals of the first node and the second node.

The second control unit is respectively connected to the first node, the second node, the second power supply end, and the second clock signal end, and is configured to provide a signal of the second power supply end to the first node under control of the second node and the second clock signal end.

The output unit is respectively connected to the fourth node, a fifth node, the first power supply end, the second power supply end, and an output end, and is configured to provide the signal of the second power supply end or the first power supply end to the output end under the control of the fourth node and the fifth node.

The voltage stabilizing unit is respectively connected to the first node, the fifth node, the output end, and the first power supply end, and is configured to keep the signal of the output end stable when the output unit provides the signal of the first power supply end to the output end.

In another aspect, an embodiment of the present disclosure provides a drive circuit, including: multiple cascaded shift registers as described above.

A signal input end of a first-stage shift register is connected to an enable signal line, a signal input end of an $n^{th}$-stage shift register is connected to an output end of an $n-1^{th}$-stage shift register, a first power supply end and second power supply end of each of the shift registers are respectively connected to a first power supply line and a second power supply line, a first clock signal end ECK and a second clock signal end ECB of an odd-stage shift register EOA are respectively connected to a first clock signal line ECK and a second clock signal line ECB, and a first clock signal end ECK and a second clock signal end ECB of an even-stage shift register EOA are respectively connected to the second clock signal line ECB and the first clock signal line ECK, wherein n is a positive integer greater than or equal to 2.

In another aspect, an embodiment of the present disclosure provides a drive method of a shift register, applied to the shift register as described above. The method includes:

a first stage: providing a signal of a signal input end to a first node, transmitting the signal of the first node to a fifth node through a first transistor, turning off a tenth transistor, turning off a third transistor, floating a fourth node, and keeping an output end to output a signal of a first power supply end under action of a first capacitor;

a second stage: providing a signal of a second power supply end to the first node, transmitting the signal of the first node to the fifth node, turning off the tenth transistor, turning on both a second transistor and the third transistor, providing a signal of a second clock signal end to the fourth node, turning on an eleventh transistor, and providing the signal of the second power supply end to the output end;

a third stage: providing the signal of a signal input end to the first node, transmitting the signal of the first node to the fifth node, turning off the tenth transistor, turning off both the third transistor and a fourth transistor, floating the fourth node to keep the state of the second stage, turning on the eleventh transistor, and providing the signal of the second power supply end to the output end;

a fourth stage: providing the signal of the second power supply end to the first node, transmitting the signal of the first node to the fifth node, turning off the tenth transistor, turning on both the second transistor and the third transistor, providing the signal of the second clock signal end to the fourth node, turning on the eleventh transistor, and providing the signal of the second power supply end to the output end; and a fifth stage: providing the signal of the signal input end to the first node, turning on the fourth transistor, providing the signal of the second power supply end to the fourth node, turning off the eleventh transistor, transmitting the signal of the first node to the fifth node, turning on the tenth transistor, and providing the signal of the first power supply end to the output end.

In another aspect, an embodiment of the present disclosure provides a display substrate, including: a display region and a bezel region located at a periphery of the display region. The display substrate includes the drive circuit as described above. The drive circuit is located in the bezel region. In the bezel region, the display substrate includes:

a base substrate;

an oxide semiconductor layer, located on a side of the base substrate and including a first active layer of a first transistor;

a first insulating layer, located on a side of the oxide semiconductor layer facing away from the base substrate;

a first metal layer, located on a side of the first insulating layer facing away from the base substrate and including a first gate electrode of the first transistor and a first plate;

a second insulating layer, located on a side of the first metal layer facing away from the base;

a second metal layer, located on a side of the second insulating layer facing away from the base substrate and including a second plate, wherein an orthographic projection of the second plate on the base substrate is within a range of an orthographic projection of the first plate on the base substrate, and the second plate and the first plate form a first capacitor;

a third insulating layer, located on a side of the second metal layer facing away from the base substrate, and provided with a first via hole and a second via hole for exposing the first active layer, a fourth via hole for exposing the first plate, and a fifth via hole for exposing the second plate; and a third metal layer, located on a side of the third insulating layer facing away from the base substrate and including an eighth metal strip and an eleventh drain electrode, wherein the eighth metal strip is connected to the first active layer through the second via hole and connected to the first plate through the fourth via hole, and the eleventh drain electrode is connected to the second plate through the fifth via hole.

In another aspect, an embodiment of the present disclosure provides a display device, including the display substrate as described above, or including the drive circuit as described above.

Other aspects will become apparent upon reading and understanding the accompanying drawings and detailed description.

BRIEF DESCRIPTION OF DRAWINGS

The accompanying drawings are used to provide an understanding of technical solutions of the present disclosure, constitute a part of the description, serve to explain the technical solutions of the present disclosure together with embodiments of the present disclosure, and are not to be construed as limitations on the technical solutions of the present disclosure.

FIG. 15b is a schematic diagram of cross-section along A-A in FIG. 15a.

FIG. 16b is a schematic diagram of cross-section along A-A in FIG. 16a.

FIG. 17b is a schematic diagram of cross-section along A-A in FIG. 17a.

FIG. 18b is a schematic diagram of cross-section along A-A in FIG. 18a.

DETAILED DESCRIPTION

Figure 1:
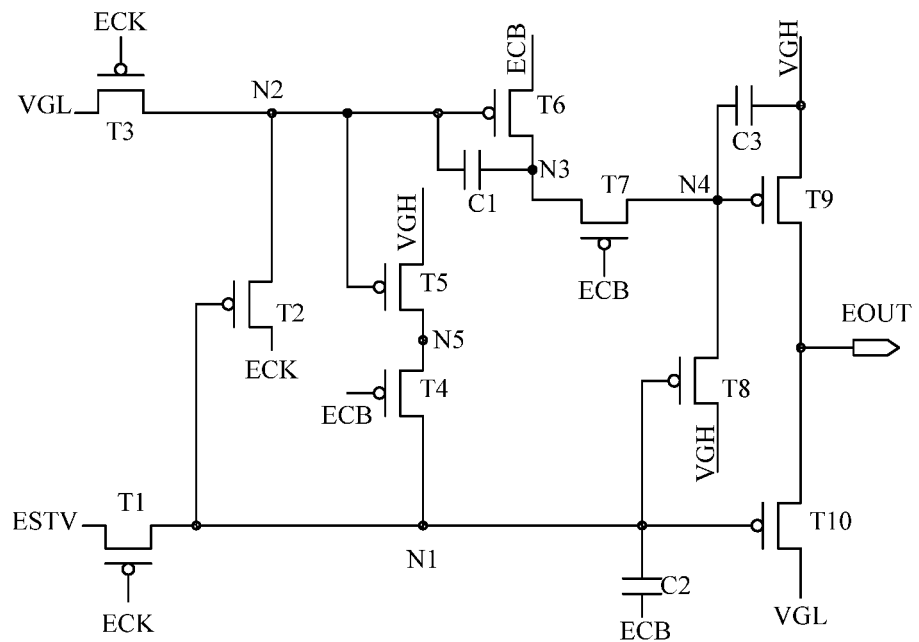
FIG. 1 is a schematic circuit diagram of a shift register.

The present disclosure describes several embodiments, but the description is exemplary rather than restrictive, and those of ordinary skill in the art will recognize that more embodiments and implementation schemes are possible within the scope of the embodiments described in the present disclosure. Although a number of possible combinations of features are shown in the drawings and discussed in the embodiments, many other combinations of the disclosed features are also possible. Unless expressly limited otherwise, any feature or element of any embodiment may be used in combination with, or in place of, any other feature or element of any other embodiment.

The present disclosure includes and contemplates combinations of features and elements known to those of ordinary skill in the art. The embodiments, features, and elements disclosed in the present disclosure may also be combined with any conventional features or elements to form a unique scheme defined by the claims. Any feature or element of any embodiment may also be combined with a features or an element from another scheme to form another unique scheme defined by the claims. Therefore, any of the features shown and/or discussed in the present disclosure may be implemented individually or in any suitable combination. Therefore, the embodiments are not limited except as by the appended claims and their equivalents. In addition, many modifications and variations are possible within the protection scope of the appended claims.

Moreover, when describing representative embodiments, the specification may have presented methods and/or processes as a particular sequence of steps. However, to the extent that the method or process does not depend on a particular order of steps described herein, the method or process should not be limited to the particular order of steps described. As will be appreciated by those of ordinary skill in the art, other orders of steps are possible. Therefore, the particular order of steps set forth in the specification should not be construed as limitations on the claims. Moreover, the claims directed to the methods and/or processes should not be limited to performing their steps in the described order, and those skilled in the art will readily appreciate that these orders may be varied and still remain within the essence and scope of the embodiments of the present disclosure.

Unless defined otherwise, technical or scientific terms used in the embodiments of the present disclosure are to be understood in a generic sense understood by those of ordinary skill in the art to which the present disclosure pertains. The use of ordinal words such as "first", "second", and "third" in the embodiments of the present disclosure do not denote any order, quantity, or importance, but rather are provided to avoid confusion between the constituent elements and are not intended to be limitations on quantity. Moreover, similar terms do not denote any order, quantity, or importance, but are used solely to distinguish one from another. The word "comprise" or "include", etc. means that an element or article that precedes the word is inclusive of the element or article listed after the word and equivalents thereof, but does not exclude other elements or articles. The terms "connection" or "connected", etc. are not limited to physical or mechanical connections, but may include electrical connections, whether direct or indirect.

Those skilled in the art will appreciate that a transistor employed in all embodiments of the present disclosure may be a thin film transistor or a field effect transistor or other devices having the same characteristics. The thin film transistor may be an oxide semiconductor thin film transistor, a low temperature polycrystalline silicon thin film transistor, an amorphous silicon thin film transistor, or a microcrystalline silicon thin film transistor. The thin film transistor may be selected as a thin film transistor with a bottom gate structure or a thin film transistor with a top gate structure as long as a switching function can be realized. Since a source and a drain of a transistor used herein are symmetrical, the source and the drain are interchangeable. In the embodiments of the present disclosure, a gate electrode of a transistor is referred to as a control electrode. In order to distinguish two electrodes of the transistor other than the gate electrode, one of the electrodes is referred to as a first electrode and the other electrode is referred to as a second electrode, the first electrode may be a source electrode or a drain electrode, and the second electrode may be a drain electrode or a source electrode.

In the embodiments of the present disclosure, "parallel" refers to a state where two straight lines form an angle above −10° and below 10°, and thus includes a state where the angle is above −5° and below 5°. In addition, "vertical" refers to a state where two straight lines form an angle above 80° and below 100°, and thus includes a state where the angle is above 85° and below 95°.

FIG. 1 is a schematic circuit diagram of a shift register. When the shift register shown in FIG. 1 is used, a signal input end ESTV inputs an ideal pulse signal. However, if a load at an output end EOUT is not sufficiently large, an output signal of the output end EOUT, in addition to being shifted with respect to an input signal, also produces pulse fluctuations of a certain amplitude in low level segments of output pulses. The pulse fluctuations reflect the current fluctuations generated on a light-emitting current of a pixel, and adversely affect the display image quality.

An embodiment of the present disclosure provides a shift register. The shift register includes an input unit, a first control unit, a second control unit, an output unit, and a voltage stabilizing unit.

The input unit is respectively connected to a signal input end, a first power supply end, a first clock signal end, a first node, and a second node, and is configured to provide a signal of the signal input end to the first node and provide a signal of the first power supply end to the second node under the control of the first clock signal end. The first control unit is respectively connected to the first node, the second node, a fourth node, a second power supply end, and a second clock signal end, and is configured to control a signal of the fourth node according to the signals of the first node and the second node. The second control unit is respectively connected to the first node, the second node, the second power supply end, and the second clock signal end, and is configured to provide a signal of the second power supply end to the first node under the control of the second node and the second clock signal end. The output unit is respectively connected to the fourth node, a fifth node, the first power supply end, the second power supply end, and an output end, and is configured to provide the signal of the second power supply end or the first power supply end to the output end under the control of the fourth node and the fifth node. The voltage stabilizing unit is respectively connected to the first node, the fifth node, the output end, and the first power supply end, and is configured to keep the signal of the output end stable when the output unit provides the signal of the first power supply end to the output end.

Hereinafter, technical solutions of the embodiments of the present disclosure will be described in detail with reference to the accompanying drawings.

Figure 2:
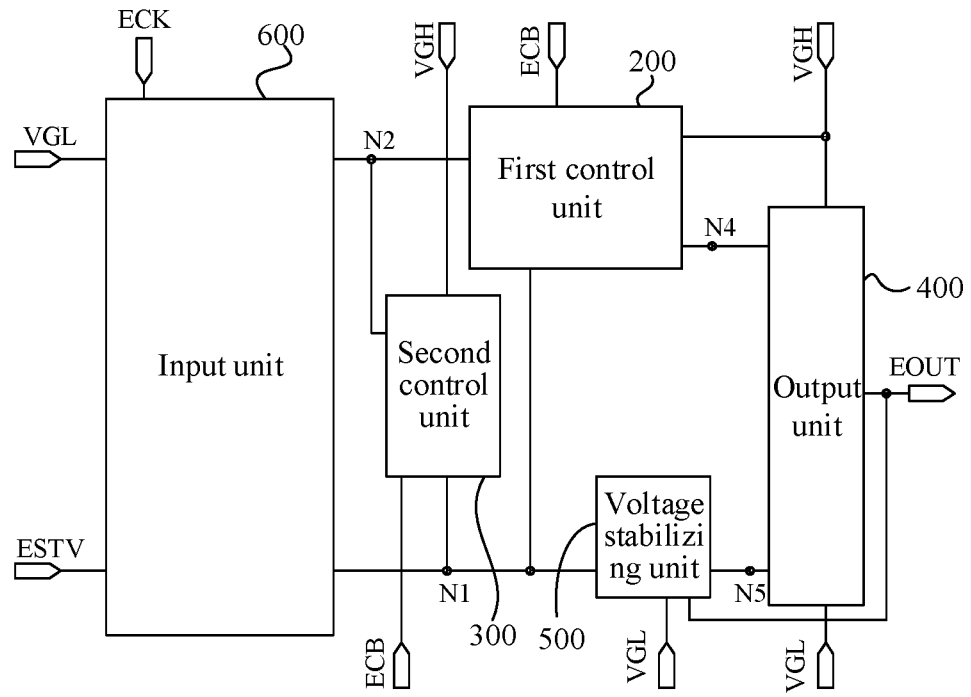
FIG. 2 is a schematic diagram of a shift register in an exemplary embodiment of the present disclosure.

FIG. 2 is a schematic diagram of a shift register in an exemplary embodiment of the present disclosure. In an exemplary embodiment, as shown in FIG. 2, the shift register may include an input unit 600, a first control unit 200, a second control unit 300, an output unit 400, and a voltage stabilizing unit 500.

The input unit 600 is respectively connected to a signal input end ESTV, a first power supply end VGL, a first clock signal end ECK, a first node N1, and a second node N2. The input unit 600 is configured to provide a signal of the signal input end ESTV to the first node N1 and provide a signal of the first power supply end VGL to the second node N2 under the control of the first clock signal end ECK.

The first control unit 200 is respectively connected to the first node N1, the second node N2, a fourth node N4, a second power supply end VGH, and a second clock signal end ECB. The first control unit 200 is configured to control a signal of the fourth node N4 according to the signals of the first node N1 and the second node N2.

The second control unit 300 is respectively connected to the first node N1, the second node N2, the second power supply end VGH, and the second clock signal end ECB. The second control unit 300 is configured to provide a signal of the second power supply end VGH to the first node N1 under the control of the second node N2 and the second clock signal end ECB.

The output unit 400 is respectively connected to the fourth node N4, a fifth node N5, the first power supply end VGL, the second power supply end VGH, and an output end EOUT, and is configured to provide the signal of the second power supply end VGH or the first power supply end VGL to the output end EOUT under the control of the fourth node N4 and the fifth node N5.

The voltage stabilizing unit 500 is respectively connected to the first node N1, the fifth node N5, the output end EOUT, and the first power supply end VGL, and is configured to keep the signal of the output end EOUT stable when the output unit 400 provides the signal of the first power supply end VGL to the output end EOUT.

According to the shift register provided by the embodiment of the present disclosure, when the output unit 400 provides the signal of the first power supply end VGL to the output end EOUT, the signal of the output end EOUT can be kept stable under the cooperative work of multiple units, so that an output signal of the output end EOUT is no longer influenced by a load size of the output end EOUT, the pulse fluctuation at the output end EOUT when the load is not sufficiently large is avoided, and the display image quality of the display device is improved.

Figure 3:
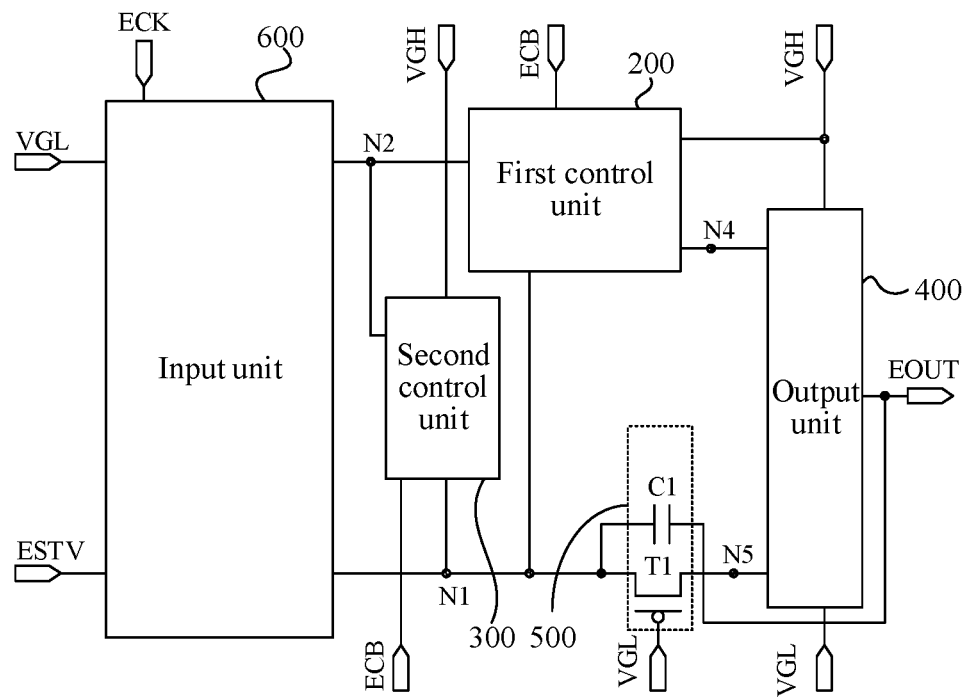
FIG. 3 is an equivalent schematic diagram of a voltage stabilizing unit in an exemplary embodiment of the present disclosure.

FIG. 3 is an equivalent schematic diagram of a voltage stabilizing unit in an exemplary embodiment of the present disclosure. In an exemplary embodiment, as shown in FIG. 3, the voltage stabilizing unit 500 may include a first transistor T1 and a first capacitor C1.

As shown in FIG. 3, the first transistor T1 has a control electrode connected to the first power supply end VGL, a first electrode connected to the first node N1, and a second electrode connected to the fifth node N5. The first capacitor C1 has a first electrode connected to the first node N1, and a second electrode connected to the output end EOUT.

In an exemplary embodiment, as shown in FIG. 3, the first transistor T1 may be a P-type transistor, the first transistor T1 is in an on-state when the signal of the first power supply end VGL is at low level, and the first transistor T1 is in an off-state when the signal of the first power supply end VGL is at high level.

The structure of the voltage stabilizing unit 500 in an exemplary embodiment is shown in FIG. 3, but it will be appreciated by those skilled in the art that the implementation of the voltage stabilizing unit is not limited thereto as long as its function can be realized.

In an exemplary embodiment, the voltage stabilizing unit 500 may include a first capacitor C1. The first capacitor C1 has a first electrode connected to the first node N1, and a second electrode connected to the output end EOUT. The fifth node N5 is connected to the first node N1.

Figure 4:
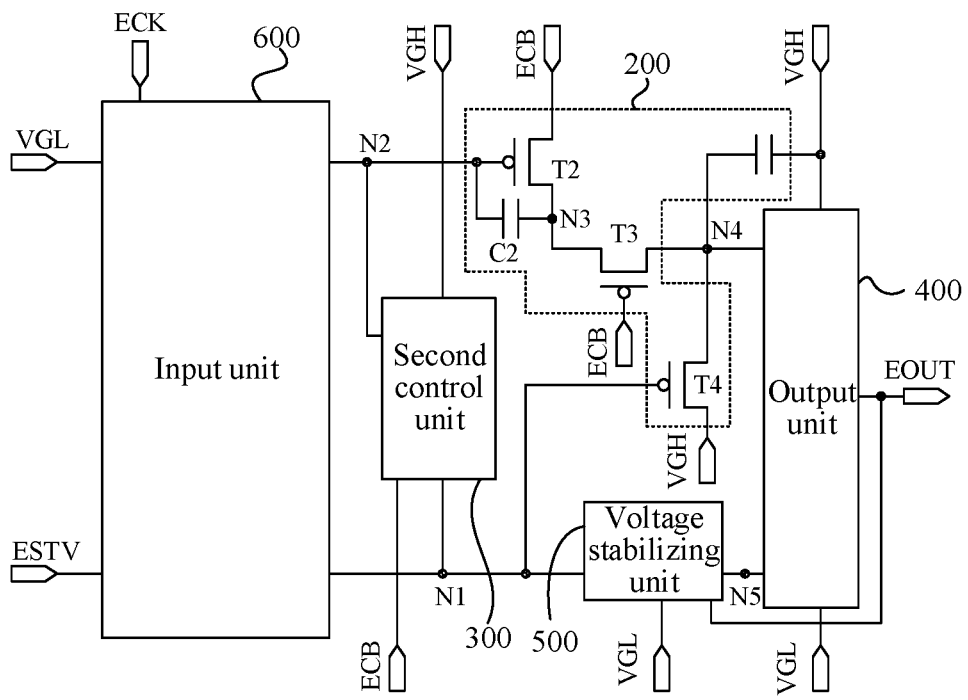
FIG. 4 is an equivalent schematic diagram of a first control unit in an exemplary embodiment of the present disclosure.

FIG. 4 is an equivalent schematic diagram of a first control unit in an exemplary embodiment of the present disclosure. In an exemplary embodiment, as shown in FIG. 4, the first control unit 200 may include a second transistor T2, a third transistor T3, a fourth transistor T4, a second capacitor C2, and a third capacitor C3.

As shown in FIG. 4, the second transistor T2 has a control electrode connected to the second node N2, a first electrode connected to the second clock signal end ECB, and a second electrode connected to the third node N3. The second capacitor C2 has a first electrode connected to the second node N2, and a second electrode connected to the third node N3. The third transistor T3 has a control electrode connected to the second clock signal end ECB, a first electrode connected to the third node N3, and a second electrode connected to the fourth node N4. The third capacitor C3 has a first electrode connected to the second power supply end VGH, and a second electrode connected to the fourth node N4. The fourth transistor T4 has a control electrode connected to the first node N1, a second electrode connected to the second power supply end VGH, and a first electrode connected to the fourth node N4.

In an exemplary embodiment, as shown in FIG. 4, the second transistor T2 may be a P-type transistor, the second transistor T2 is in an on-state when a signal of the second node N2 is at low level, and the second transistor T2 is in an off-state when the signal of the second node N2 is at high level. The third transistor T3 may be a P-type transistor, the third transistor T3 is in an on-state when a signal of the second clock signal end ECB is at low level, and the third transistor T3 is in an off-state when the signal of the second clock signal end ECB is at high level. The fourth transistor T4 may be a P-type transistor, the fourth transistor T4 is in an on-state when a signal of the first node N1 is at low level, and the fourth transistor T4 is in an off-state when the signal of the first node N1 is at high level.

The structure of the first control unit 200 in an exemplary embodiment is shown in FIG. 4, but it will be appreciated by those skilled in the art that implementations of the first control unit are not limited thereto as long as its function can be realized.

Figure 5:
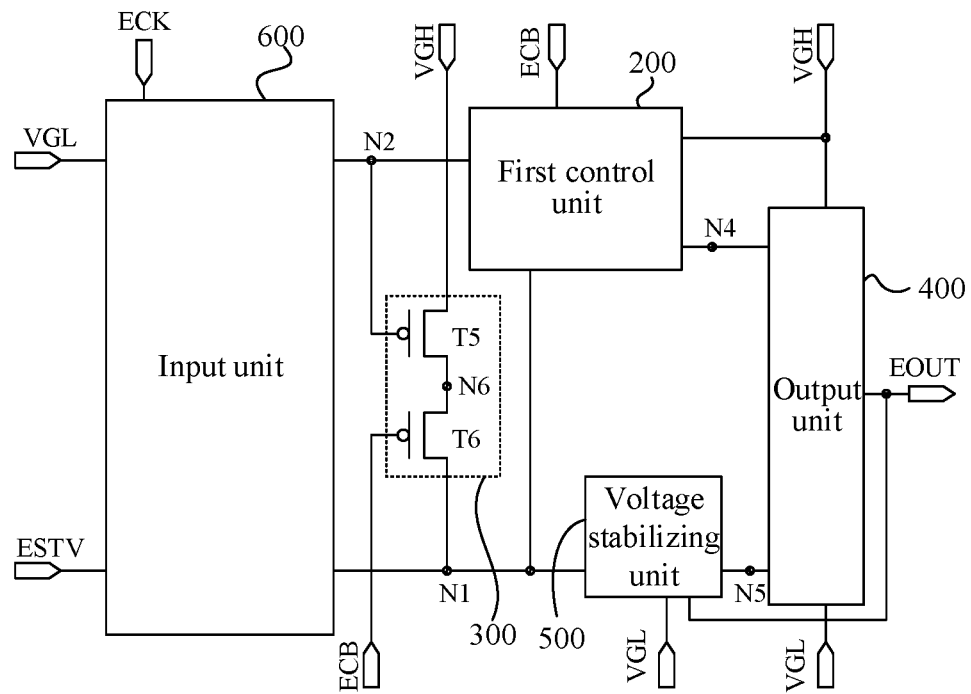
FIG. 5 is an equivalent schematic diagram of a second control unit in an exemplary embodiment of the present disclosure.

FIG. 5 is an equivalent schematic diagram of a second control unit in an exemplary embodiment of the present disclosure. In an exemplary embodiment, as shown in FIG. 5, the second control unit 300 may include a fifth transistor T5 and a sixth transistor T6.

As shown in FIG. 5, the fifth transistor T5 has a control electrode connected to the second node N2, a first electrode connected to the second signal end VGH, and a second electrode connected to a sixth node N6. The sixth transistor T6 has a control electrode connected to the second clock signal end ECB, a first electrode connected to the sixth node N6, and a second electrode connected to the first node N1.

In an exemplary embodiment, as shown in FIG. 5, the fifth transistor T5 may be a P-type transistor, the fifth transistor T5 is in an on-state when the signal of the second node N2 is at low level, and the fifth transistor T5 is in an off-state when the signal of the second node N2 is at high level. The sixth transistor T6 may be a P-type transistor, the sixth transistor T6 is in an on-state when the signal of the second clock signal end ECB is at low level, and the sixth transistor T6 is in an off-state when the signal of the second clock signal end ECB is at high level.

The structure of the second control unit 300 in an exemplary embodiment is shown in FIG. 5, but it will be appreciated by those skilled in the art that the implementations of the second control unit are not limited thereto as long as its function can be realized.

Figure 6:
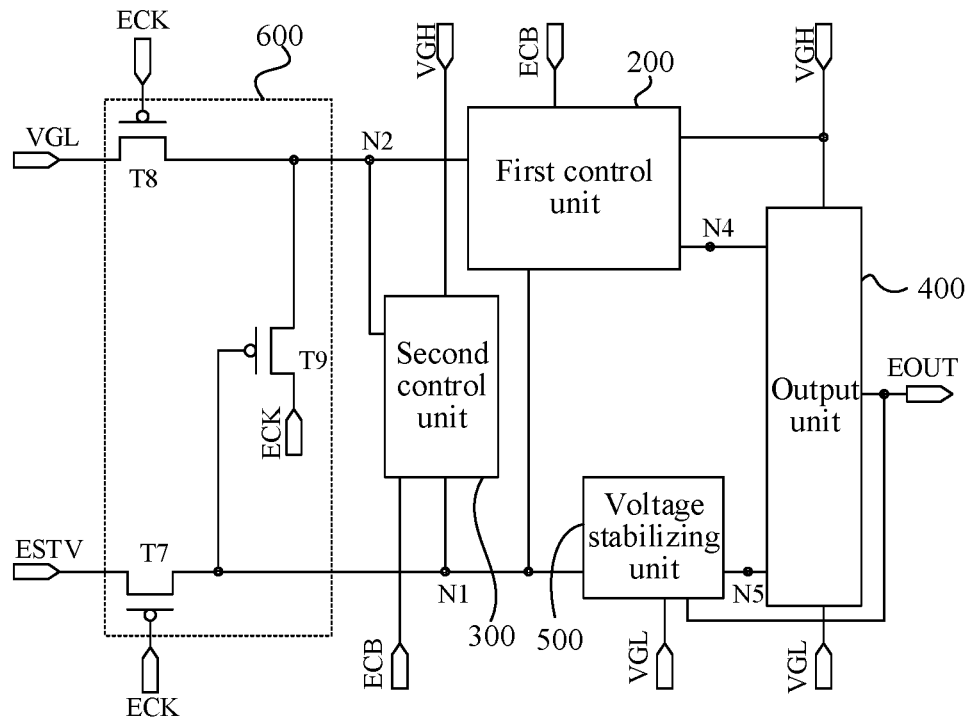
FIG. 6 is an equivalent schematic diagram of an input unit in an exemplary embodiment of the present disclosure.

FIG. 6 is an equivalent schematic diagram of an input unit in an exemplary embodiment of the present disclosure. In an exemplary embodiment, as shown in FIG. 6, the input unit 600 may include a seventh transistor T7, an eighth transistor T8, and a ninth transistor T9.

As shown in FIG. 6, the seventh transistor T7 a control electrode connected to the first clock signal end ECK, a first electrode connected to the signal input end ESTV, and the second electrode is connected to the first node N1. The eighth transistor T8 has a control electrode connected to the first clock signal end ECK, a first electrode connected to the first power supply end VGL, and a second electrode connected to the second node N2. The ninth transistor T9 has a control electrode connected to the first node N1, a first electrode connected to the first clock signal end ECK, and a second electrode connected to the second node N2.

In an exemplary embodiment, as shown in FIG. 6, the seventh transistor T7, the eighth transistor T8, and the ninth transistor T9 may all be P-type transistors. When a signal of the first clock signal end ECK is at low level, the seventh transistor T7 and the eighth transistor T8 are both turned on, and when the signal of the first clock signal end ECK is at high level, the seventh transistor T7 and the eighth transistor T8 are both turned off. When the signal of the first node N1 is at low level, the ninth transistor T9 is turned on, and when the signal of the first node N1 is at high level, the ninth transistor T9 is turned off.

The structure of the input unit 600 in an exemplary embodiment is shown in FIG. 6, but it will be appreciated by those skilled in the art that the implementations of the input unit are not limited thereto as long as its function can be realized.

Figure 7:
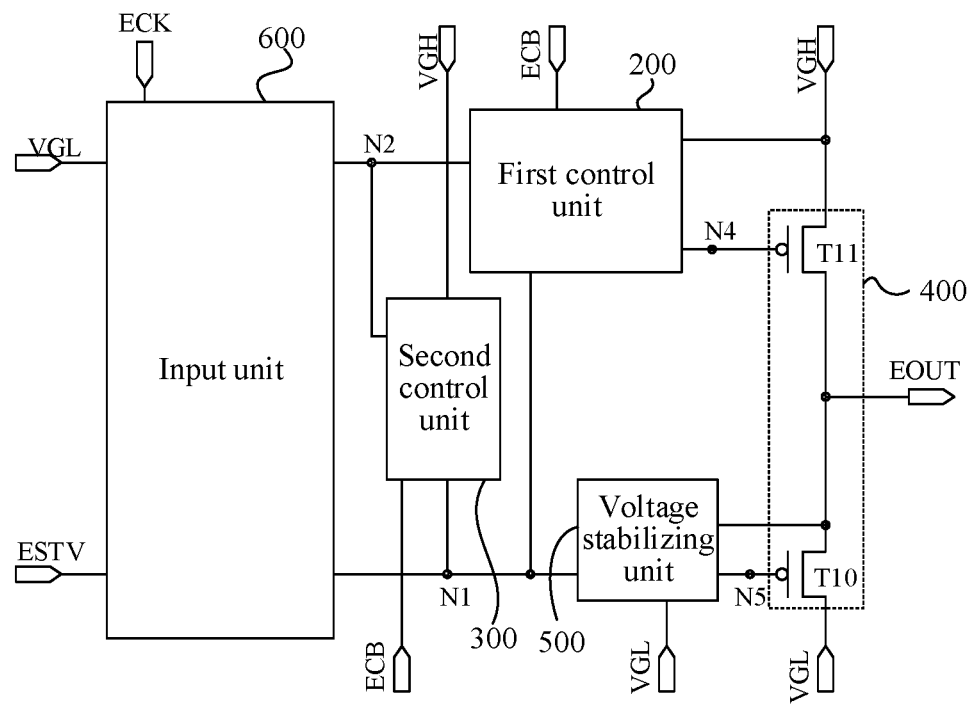
FIG. 7 is an equivalent schematic diagram of an output unit in an exemplary embodiment of the present disclosure.

FIG. 7 is an equivalent schematic diagram of an output unit in an exemplary embodiment of the present disclosure. In an exemplary embodiment, as shown in FIG. 7, the output unit 400 may include a tenth transistor T10 and an eleventh transistor T11.

As shown in FIG. 7, the tenth transistor 10 has a control electrode connected to the fifth node N5, a first electrode connected to the first power supply end VGL, and a second electrode connected to the output end EOUT. The eleventh transistor T11 has a control electrode connected to the fourth node N4, a first electrode connected to the second power supply end VGH, and a second electrode connected to the output end EOUT.

In an exemplary embodiment, as shown in FIG. 7, both the tenth transistor T10 and the eleventh transistor T11 may be P-type transistors. The tenth transistor T10 is in an on-state when a signal of the fifth node N5 is at low level, and the tenth transistor T10 is in an off-state when the signal of the fifth node N5 is at high level. The eleventh transistor T11 is in an on-state when the signal of the fourth node N4 is at low level, and the eleventh transistor T11 is in an off-state when the signal of the fourth node N4 is at high level.

The structure of the output unit 400 in an exemplary embodiment is shown in FIG. 7, but it will be appreciated by those skilled in the art that the implementations of the output unit are not limited thereto as long as its function can be realized.

Figure 8:
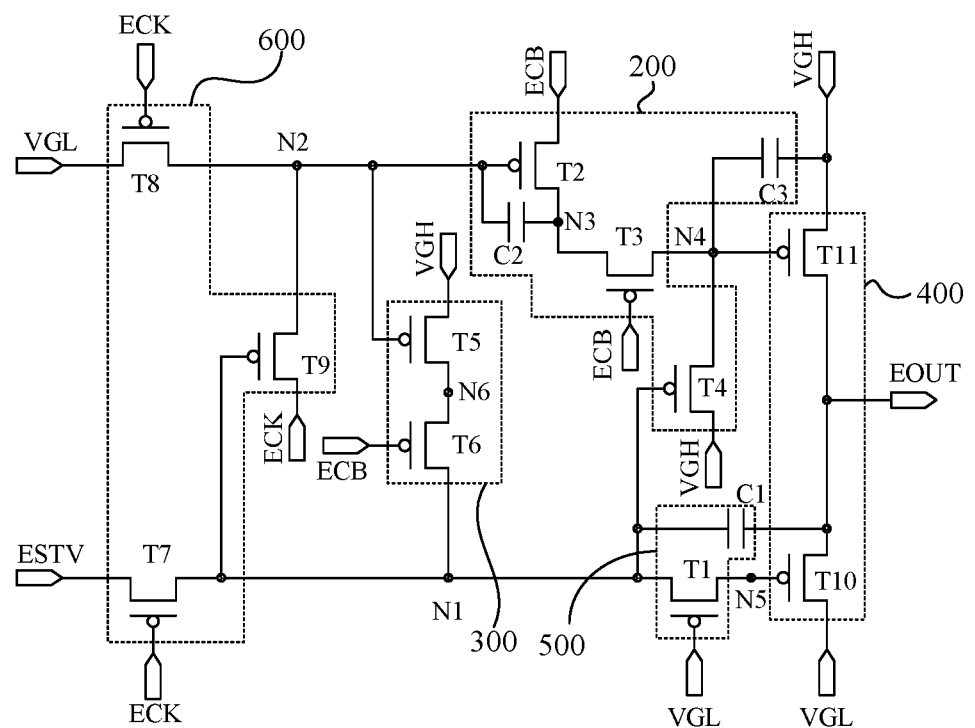
FIG. 8 is an equivalent schematic diagram of a shift register in an exemplary embodiment of the present disclosure.

FIG. 8 is an equivalent schematic diagram of a shift register in an exemplary embodiment of the present disclosure. In an exemplary embodiment, as shown in FIG. 8, the input unit 600 may include a seventh transistor T7, an eighth transistor T8, and a ninth transistor T9. The first control unit 200 may include a second transistor T2, a third transistor T3, a fourth transistor T4, a second capacitor C2, and a third capacitor C3. The second control unit 300 may include a fifth transistor T5 and a sixth transistor T6. The output unit 400 may include a tenth transistor T10 and an eleventh transistor T11. The voltage stabilizing unit 500 may include a first transistor T1 and a first capacitor C1.

In an exemplary embodiment, as shown in FIG. 8, the seventh transistor T7 has a control electrode connected to the first clock signal end ECK, a first electrode connected to the signal input end ESTV, and a second electrode connected to the first node N1. The eighth transistor T8 has a control electrode of connected to the first clock signal end ECK, a first electrode connected to the first power supply end VGL, and a second electrode connected to the second node N2. The ninth transistor T9 has a control electrode connected to the first node N1, a first electrode connected to the first clock signal end ECK, and a second electrode connected to the second node N2. The second transistor T2 has a control electrode connected to the second node N2, a first electrode connected to the second clock signal end ECB, and a second electrode connected to the third node N3. The second capacitor C2 has a first electrode connected to the second node N2, and a second electrode connected to the third node N3. The third transistor T3 has a control electrode connected to the second clock signal end ECB, a first electrode connected to the third node N3, and a second electrode connected to the fourth node N4. The third capacitor C3 has a first electrode connected to the second power supply end VGH, and a second electrode connected to the fourth node N4. The fourth transistor T4 has a control electrode connected to the first node N1, a second electrode connected to the second power supply end VGH, and a first electrode connected to the fourth node N4. The fifth transistor T5 has a control electrode connected to the second node N2, a first electrode connected to the second signal end VGH, and a second electrode connected to a sixth node N6. The sixth transistor T6 has a control electrode connected to the second clock signal end ECB, a first electrode connected to the sixth node N6, and a second electrode connected to the first node N1. The tenth transistor 10 has a control electrode connected to the fifth node N5, a first electrode connected to the first power supply end VGL, and a second electrode connected to the output end EOUT. The eleventh transistor T11 has a control electrode connected to the fourth node N4, a first electrode connected to the second power supply end VGH, and a second electrode connected to the output end EOUT. The first transistor T1 has a control electrode connected to the first power supply end VGL, a first electrode connected to the first node N1, and a second electrode connected to the fifth node N5. The first capacitor C1 has a first electrode connected to the first node N1, and a second electrode connected to the output end EOUT.

An embodiment of the present disclosure provides a drive method of the shift register as described above. The method may include:

In a first stage, a signal of a signal input end is provided to a first node, the signal of the first node is transmitted to a fifth node through a first transistor, a tenth transistor is turned off, a third transistor T3 is turned off, a fourth node is floated, and an output end is kept outputting a signal of a first power supply end under the action of a first capacitor.

In a second stage, a signal of a second power supply end is provided to the first node, the signal of the first node is transmitted to the fifth node, the tenth transistor is turned off, both a second transistor and the third transistor are turned off, a signal of a second clock signal end is provided to the fourth node, an eleventh transistor is turned on, and the signal of the second power supply end is provided to the output end.

In a third stage, a signal of a signal input end is provided to the first node, the signal of the first node is transmitted to the fifth node, the tenth transistor is turned off, both the third transistor and a fourth transistor are turned off, the fourth node is floated to keep the state of the second stage, the eleventh transistor is turned on, and the signal of the second power supply end is provided to the output end.

In a fourth stage, the signal of the second power supply end is provided to the first node, the signal of the first node is transmitted to the fifth node, the tenth transistor is turned off, both the second transistor and the third transistor are turned on, the signal of the second clock signal end is provided to the fourth node, the eleventh transistor is turned on, and the signal of the second power supply end is provided to the output end.

In a fifth stage, the signal of the signal input end is provided to the first node, the fourth transistor is turned on, the signal of the second power supply end is provided to the fourth node, the eleventh transistor is turned off, the signal of the first node is transmitted to the fifth node, the tenth transistor is turned on, and the signal of the first power supply end is provided to the output end.

In an exemplary embodiment, the drive method may further include:

In a sixth stage, the output end continuously outputs the signal of the first power supply end.

In an exemplary embodiment, the drive method may further include:

The first clock signal end and the second clock signal end are continuously switched between a high level and a low level, respectively. One of the first clock signal end and the second clock signal end, which has an ascending level, is changed first. That is, the level of one of the first clock signal end and the second clock signal end ascends earlier than the other one of the first clock signal end and the second clock signal end. For example, the level of the first clock signal end ascends earlier than that of the second clock signal end, or the level of the second clock signal end ascends earlier than that of the first clock signal end.

Figure 9:
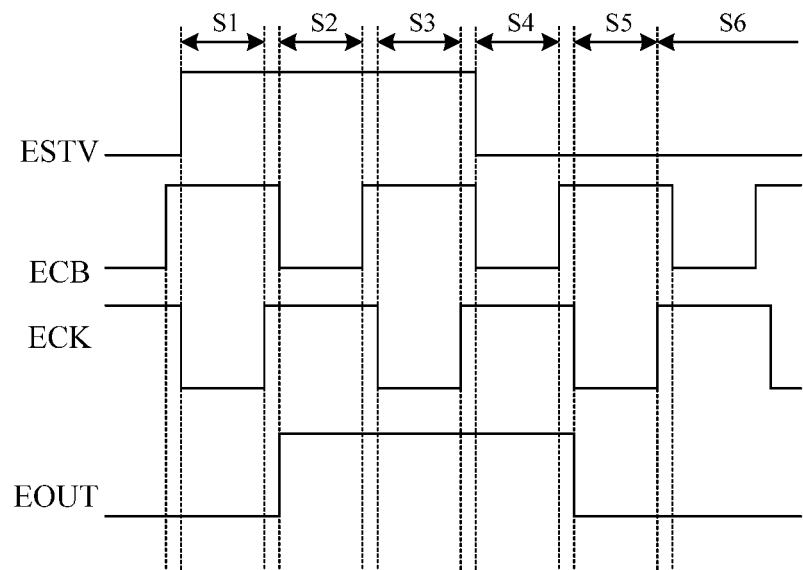
FIG. 9 is a schematic timing diagram of a shift register in an exemplary embodiment of the present disclosure.

FIG. 9 is a schematic timing diagram of a shift register in an exemplary embodiment of the present disclosure. The working process of the shift register in the embodiment of the present disclosure shown in FIG. 8 is described below with reference to a timing diagram and a drive method of the shift register.

An illustration is made with all transistors being P-type transistors in FIG. 8. The first power supply end VGL continuously outputs a low level, and the second power supply end VGH continuously outputs a high level. When the low level is applied to a control electrode of a P-type transistor, the P-type transistor is turned on, and when the high level is applied to the control electrode of the P-type transistor, the P-type transistor is turned off. Accordingly, a clock signal is a signal that periodically switches between two different levels, which are used for turning the transistor on and off respectively, so that a higher level of the two different levels is referred to as the high level and a lower level is referred to as the low level.

It should be understood, however, that level values of the high/low levels in the first power supply end and the second power supply end are not necessarily respectively equal to level values of the high/low levels in the clock signal (although they may be equal for simplifying the driving).

Figure 10:
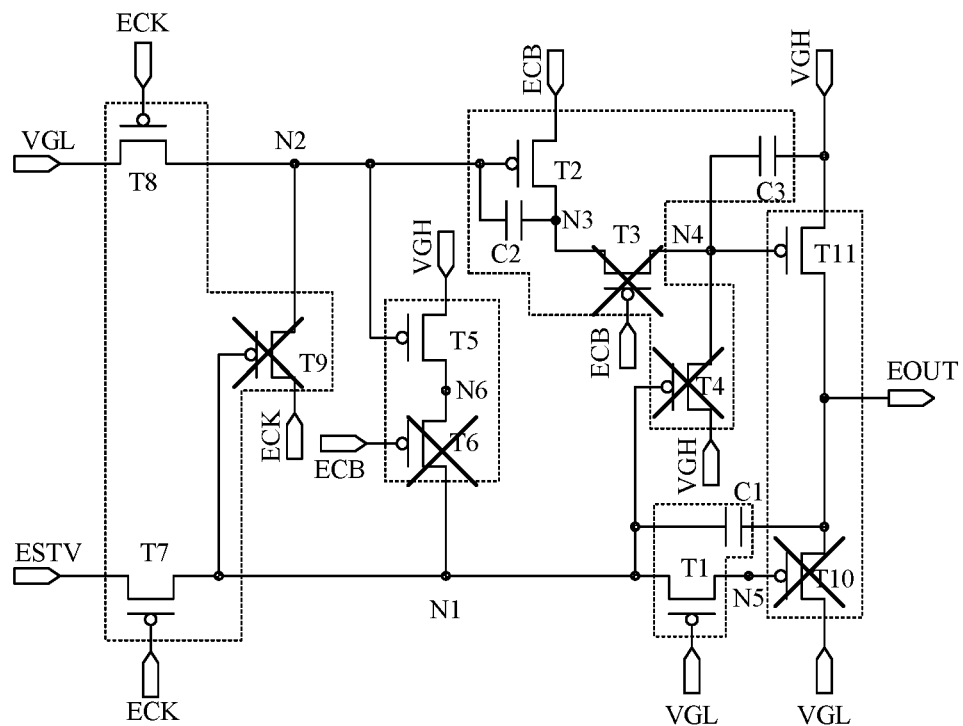
FIG. 10 is a schematic state diagram of a shift register in a first stage.

Referring to FIG. 9, in an exemplary embodiment of the present disclosure, a working process of the shift register is as follows:

In a first stage S1, the first clock signal end ECK may be at low level, the second clock signal end ECB may be at high level, and the signal input end ESTV may be at high level. FIG. 10 is a schematic state diagram of a shift register in the first stage S1.

In an exemplary embodiment, in the first stage, a signal of a signal input end may be provided to a first node, the signal of the first node is transmitted to a fifth node through a first transistor, a tenth transistor is turned off, a third transistor T3 is turned off, a fourth node is floated, and an output end is kept outputting a signal of a first power supply end under the action of a first capacitor.

In an exemplary embodiment, as shown in FIG. 10, in the first stage S1, the first clock signal end ECK is at low level, the seventh transistor T7 is turned on, a signal of the signal input end ESTV is provided to the first node N1, the first transistor T1 is turned on, the signal of the first node N1 is transmitted to the fifth node N5 through the first transistor T1, the first node N1 and the fifth node N5 are both at high level, the ninth transistor T9, the fourth transistor T4, and the tenth transistor T10 are all turned off, and the signal of the first power supply end VGL cannot be provided to the output end EOUT.

The eighth transistor T8 is turned on, a signal of the first power supply end VGL is provided to the second node N2, and the second node N2 is at low level. The fifth transistor T5 is turned on, a signal of the second power supply end VGH is provided to the sixth node N6, and the sixth node N6 is at high level. The second clock signal end ECB is at high level, and the sixth transistor T6 is turned off. The second transistor T2 is turned on, a signal of the second clock signal end ECB is provided to the third node N3, the third node N3 is at high level, and a second capacitor C2 is charged. The third transistor T3 is turned off, the fourth node N4 is floated, the previous high level is kept (the previous level state of the fourth node N4 is to be described later), and an eleventh transistor is controlled to be turned off. The output end EOUT keeps the previous low level output (the previous level state of the output end EOUT is to be described later).

In an exemplary embodiment, in the present stage, the level of the second clock signal end ECB may be changed earlier than the level of the first clock signal end ECK, i.e. the level of the first clock signal end ECK descends after the level of the second clock signal end ECB ascends. Therefore, the situation that the first clock signal end ECK and the second clock signal end ECB are at low level at the same time due to errors can be avoided, the third transistor T3 is ensured to be turned off firstly so that the fourth node N4 is floated to keep the previous high level, and high level output of the second power supply end VGH is avoided.

Figure 11:
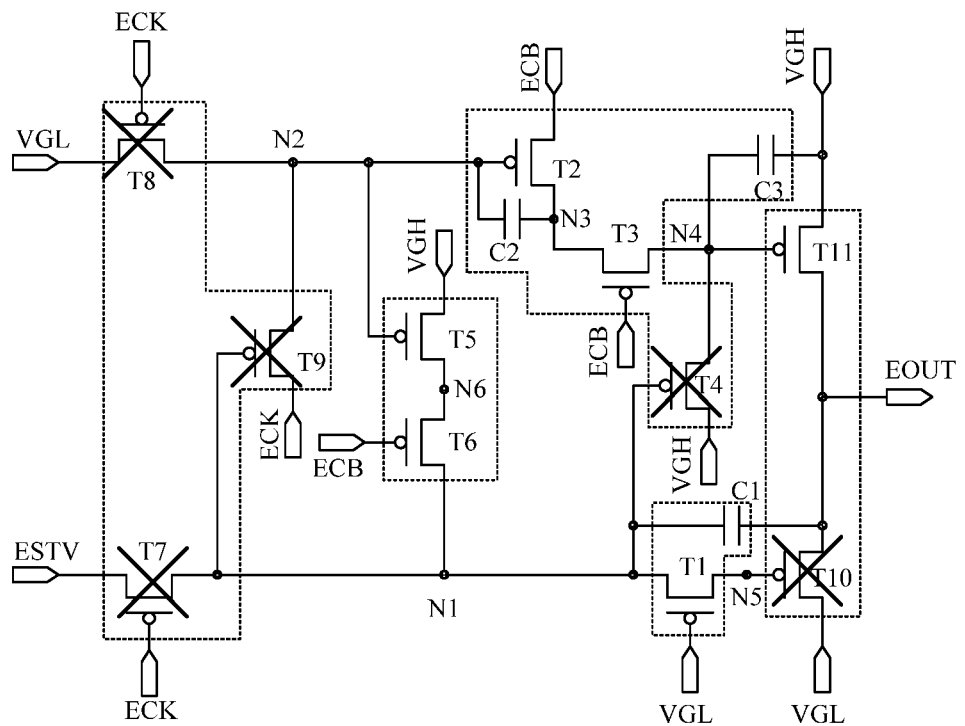
FIG. 11 is a schematic state diagram of a shift register in a second stage.

In a second stage S2, the first clock signal end ECK is at high level, the second clock signal end ECB is at low level, and the signal input end ESTV is at high level. FIG. 11 is a schematic state diagram of a shift register in the second stage.

In an exemplary embodiment, in the second stage, the signal of the second power supply end may be provided to the first node, the signal of the first node is transmitted to the fifth node, the tenth transistor is turned off, both the second transistor and the third transistor are turned off, the signal of the second clock signal end is provided to the fourth node, the eleventh transistor is turned on, and the signal of the second power supply end is provided to the output end.

In an exemplary embodiment, as shown in FIG. 11, in the second stage S2, the first clock signal end ECK may be at high level, and both the seventh transistor T7 and the eighth transistor T8 are turned off. The second node N2 is floated to keep the previous low level, and the second transistor T2 is turned on, so that the third node N3 is changed from the high level to the low level. Due to a bootstrapping effect of the second capacitor C2, the level of the second node N2 is further pulled lower from the low level, thereby enhancing output capability of the fifth transistor T5. The sixth transistor T6 is turned on, the signal of the second power supply end VGH is provided to the first node N1 through the fifth transistor T5, the sixth node N6, and the sixth transistor T6, and the first node N1 is kept at high level. The signal of the first node N1 is transmitted to the fifth node N5 through the first transistor, and both the first node N1 and the fifth node N5 are at high level. The ninth transistor T9 is turned off, the fourth transistor T4 is turned off, the tenth transistor T10 is turned off, and the signal of the first power supply end VGL cannot be provided to the output end EOUT.

The third transistor T3 is turned on, the low level of the third node N3 is transmitted to the fourth node N4 through the third transistor T3, the fourth node N4 is at low level, the eleventh transistor T11 is turned on, the signal of the second power supply end VGH is provided to the output end EOUT, and the output end EOUT outputs the high level.

In an exemplary embodiment, in the present stage, the level of the first clock signal end ECK may ascend and then the level of the second clock signal end ECB descends. Therefore, the level of the second node N2 can be ensured to be reduced further after the second node is changed into a floated state, the low level of the second node N2 can be ensured to enable the fifth transistor T5 to be turned on, so that the state change of each transistor is more reliable.

In a third stage S3, the first clock signal end ECK may be at low level, the second clock signal end ECB may be at high level, and the signal input end ESTV may be high level. In the third stage S3, the state of each transistor in the shift register is the same as the first stage S1.

In an exemplary embodiment, in the third stage, the signal of the signal input end may be provided to the first node, the signal of the first node is transmitted to the fifth node, the tenth transistor is turned off, both the third transistor and the fourth transistor are turned off, the fourth node is floated to keep the state of the second stage, the eleventh transistor is turned on, and the signal of the second power supply end is provided to the output end.

In an exemplary embodiment, referring to FIG. 10, in the third stage S3, the first clock signal end ECK may be at low level, the seventh transistor T7 is turned on, and the signal of the signal input end ESTV is provided to the first node N1. The first transistor T1 is turned on, the signal of the first node N1 is transmitted to the fifth node N5 through the first transistor T1, the first node N1 and the fifth node N5 are both at high level, the ninth transistor T9, the fourth transistor T4, and the tenth transistor T10 are all turned off, and the signal of the first power supply end VGL cannot be provided to the output end EOUT.

The eighth transistor T8 is turned on, the signal of the first power supply end VGL is provided to the second node N2, and the second node N2 is kept at low level. The fifth transistor T5 is turned on, the signal of the second power supply end VGH is provided to the sixth node N6, and the sixth node N6 is at high level. The second clock signal end ECB is at high level, and the sixth transistor T6 is turned off. The second transistor T2 is turned on, the signal of the second clock signal end ECB is provided to the third node N3, the third node N3 is at high level, and the second capacitor C2 is charged. The third transistor T3 is turned off, the fourth node N4 is floated to keep the state of the second stage (i.e. low level), the eleventh transistor is turned on, the signal of the second power supply end VGH is provided to the output end EOUT, and the output end EOUT outputs the high level.

In an exemplary embodiment, in the present stage, the level of the second clock signal end ECB may be changed earlier than the level of the first clock signal end ECK, i.e. the level of the first clock signal end ECK descends after the level of the second clock signal end ECB ascends. Therefore, it is ensured that the third transistor T3 is turned off so that the fourth node N4 is floated to keep the previous low level.

In a fourth stage S4, the first clock signal end ECK may be high level, the second clock signal end ECB may be low level, and the signal input end ESTV may be low level. In the fourth stage S4, the state of each transistor in the shift register is the same as the second stage S2.

In an exemplary embodiment, in the fourth stage, a signal of a second power supply end may be provided to the first node, the signal of the first node is transmitted to the fifth node, the tenth transistor is turned off, both a second transistor and the third transistor are turned off, a signal of a second clock signal end is provided to the fourth node, an eleventh transistor is turned on, and the signal of the second power supply end is provided to the output end.

In an exemplary embodiment, referring to FIG. 11, in the fourth stage S4, the first clock signal end ECK may be high level, and both the seventh transistor T7 and the eighth transistor T8 are turned off. The second node N2 is floated to keep the previous low level, and the second transistor T2 is turned on, so that the third node N3 is changed from the high level to the low level. Due to a bootstrapping effect of the second capacitor C2, the level of the second node N2 is further pulled low from the low level, thereby enhancing the output capability of the fifth transistor T5. The sixth transistor T6 is turned on, a signal of the second power supply end VGH is provided to the first node N1 through the fifth transistor T5, the sixth node N6, and the sixth transistor T6, and the first node N1 is kept high level. The first transistor T1 is turned on, a signal of the first node N1 is transmitted to the fifth node N5 through the first transistor T1, and the fifth node N5 is kept high level. The ninth transistor T9 is turned off, the fourth transistor T4 is turned off, the tenth transistor T10 is turned off, and a signal of the first power supply end VGL cannot be provided to the output end EOUT.

The third transistor T3 is turned on, the low level of the third node N3 is transmitted to the fourth node N4 through the third transistor T3, the fourth node N4 is low level, the eleventh transistor T11 is turned on, a signal of the second power supply end VGH is provided to the output end EOUT, and the output end EOUT outputs the high level.

In an exemplary embodiment, in the present stage, the level of the first clock signal end ECK may ascend and then the level of the second clock signal end ECB descends. Therefore, the level of the second node N2 can be ensured to be reduced further after the second node is changed into a floated state, the low level of the second node N2 can be ensured to enable the fifth transistor T5 to be turned on, and the state change of each transistor is more reliable.

Figure 12:
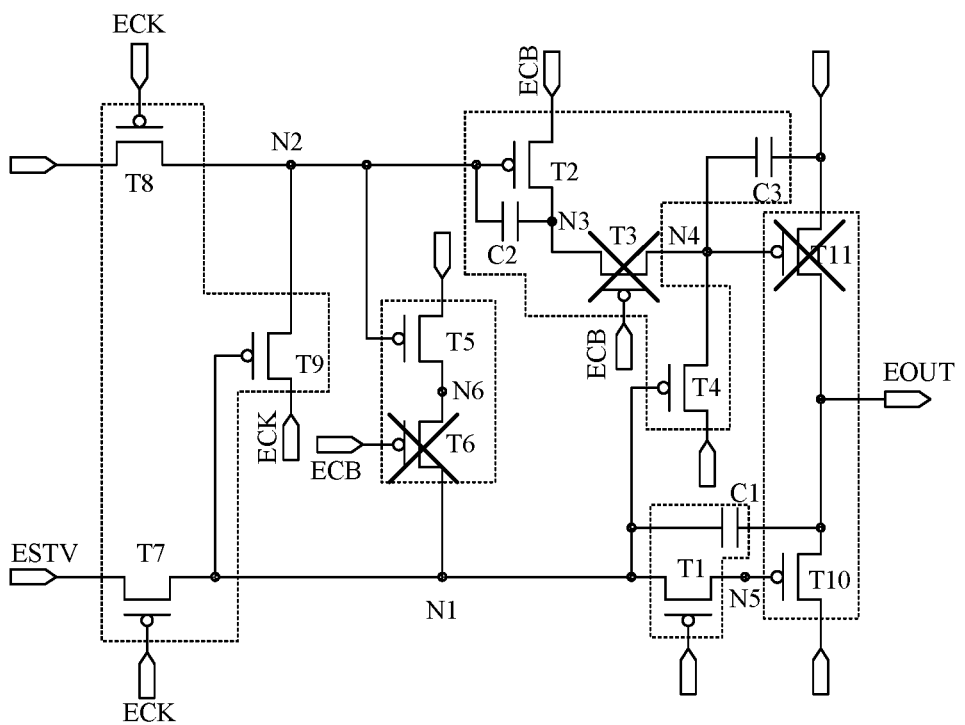
FIG. 12 is a schematic state diagram of a shift register in a fifth stage.

In a fifth stage S5, the first clock signal end ECK is at low level, the second clock signal end ECB is at high level, and the signal input end ESTV is at low level. FIG. 12 is a schematic state diagram of a shift register in the fifth stage.

In an exemplary embodiment, in the fifth stage, the signal of the signal input end may be provided to the first node, the fourth transistor is turned on, the signal of the second power supply end is provided to the fourth node, the eleventh transistor is turned off, the signal of the first node is transmitted to the fifth node, the tenth transistor is turned on, and the signal of the first power supply end is provided to the output end.

In an exemplary embodiment, as shown in FIG. 12, in the fifth stage S5, the first clock signal end ECK may be at low level, and both the eighth transistor T8 and the ninth transistor T9 are turned on, the signal of the first power supply end VGL and the signal of the first clock signal end ECK are both provided to the second node N2, and the second node N2 is kept at the low level. The fifth transistor T5 is turned on under the control of the second node N2, and the signal of the second power supply end VGH is provided to the sixth node N6. The second clock signal end ECB is at high level, and the sixth transistor T6 is turned off. The second transistor T2 is turned on, the signal of the second clock signal end ECB is provided to the third node N3, the third node N3 turns to high level, and the second capacitor C2 is charged. The second clock signal end ECB is at high level, and the third transistor T3 is turned off. The seventh transistor T7 is turned on, and the signal of the signal input end ESTV is provided to the first node N1. The first node N1 is at low level. Under the control of the low level of the first node N1, the fourth transistor T4 is turned on, the signal of the second power supply end VGH is provided to the fourth node N4, the fourth node N4 is at high level, so that the eleventh transistor T11 is turned off, and the signal of the second power supply end VGH cannot be provided to the output end EOUT.

The first transistor T1 is turned on, a low level signal of the first node N1 is transmitted to the fifth node N5 through the first transistor T1, the fifth node N5 is at low level, the tenth transistor T10 is turned on, the signal of the first power supply end VGL is provided to the output end EOUT through the tenth transistor T10, and the output end EOUT outputs a low level.

In an exemplary embodiment, in the present stage, the level of the second clock signal end ECB may be changed earlier than the level of the first clock signal end ECK, i.e. the level of the first clock signal end ECK descends after the level of the second clock signal end ECB ascends. Therefore, it is ensured that the third transistor T3 is turned off so that the fourth node N4 is floated to ensure that a high level signal of the second power supply end VGH may be provided to the fourth node N4.

Figure 13:
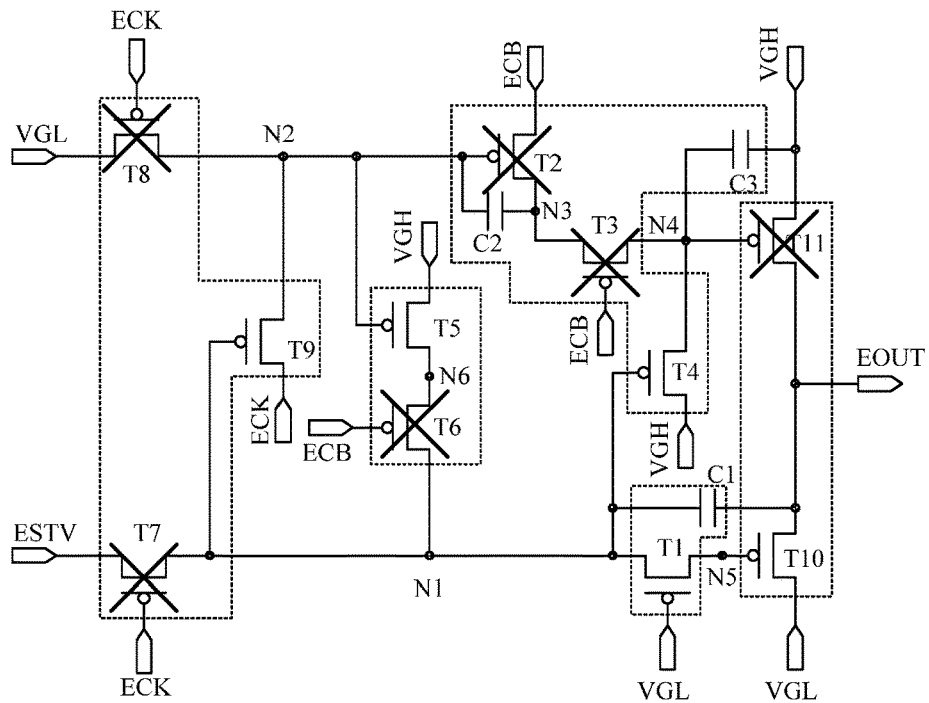
FIG. 13 is a schematic state diagram of a shift register in a transition stage of a sixth stage.

In a sixth stage S6, the signal input end ESTV may be continuously at low level, and the first clock signal end ECK and the second clock signal end ECB are respectively continuously switched between the high level and the low level, i.e. the present stage is a holding stage with a long time until arrival of the next first stage S1. FIG. 13 is a schematic state diagram of a shift register in a transition stage of the sixth stage.

In an exemplary embodiment, in the sixth stage, the output end may continuously output the signal of the first power supply end.

In an exemplary embodiment, as shown in FIG. 13, the sixth stage S6 may include a transition stage S6'. In the transition stage S6', the first clock signal end ECK and the second clock signal end ECB may both be at high level, the sixth transistor T6, the seventh transistor T7, and the eighth transistor T8 are all controlled to be turned off, and the first node N1 is floated and kept at low level. The first node N1 controls the ninth transistor T9 to be turned on, and a high level signal of the first clock signal end ECK is provided to the second node N2, so that the second node N2 turns to high level, and the second transistor T2 is controlled to be turned off. The third transistor T3 is turned off. Under the control of the low level of the first node N1, the fourth transistor T4 is turned on, the signal of the second power supply end VGH is provided to the fourth node N4, the fourth node N4 is at high level, the eleventh transistor T11 is controlled to be turned off, and a high level signal of the second power supply end VGH cannot be output to the output end EOUT. The low level of the first node N1 is transmitted to the fifth node N5, the tenth transistor T10 is controlled to be turned on, the signal of the first power supply end VGL is provided to the output end EOUT, and the output end EOUT continuously outputs the low level.

In time except the transition stage, when the first clock signal end ECK is at low level and the second clock signal end ECB is at high level, the circuit state is the same as that in the fifth stage, and the shift register outputs the low level.

When the first clock signal end ECK is at high level and the second clock signal end ECB is at low level, the first node N1 and the second node N2 are both floated. Although the sixth transistor is turned on under the control of the second clock signal end ECB, the first capacitor C1 may cause the first node N1 to keep the low level, so that the tenth transistor T10 is kept turned on, the signal of the first power supply end VGL is provided to the output end EOUT, and the output end EOUT continuously outputs the low level. The first node N1 keeps the low level, and may control the ninth transistor T9 to be turned on, and the signal of the first clock signal end ECK is provided to the second node N2, so that the second node N2 is at high level, and the second transistor T2 is controlled to be turned off. Under the control of the low level of the first node N1, the fourth transistor T4 is continuously turned on, the signal of the second power supply end VGH is continuously provided to the fourth node N4, the fourth node N4 keeps the high level, and the eleventh transistor T11 is turned off.

Therefore, in the sixth stage S6 (i.e. after the fifth stage S5 and before arrival of a next first stage S1), the signal of the first power supply end VGL may be continuously provided to the output end EOUT, and the output end EOUT continuously outputs the low level.

The high level kept by the fourth node N4 is a level state before the first stage S1 of the fourth node N4 which is described in the first stage S1, and the low level output by the output end EOUT is a level state before the first stage S1 of the output end EOUT which is described in the first stage S1.

In the sixth stage S6, since one of the first clock signal end ECK and the second clock signal end ECB, which has an ascending level, is changed first, there will be partial time when both the first clock signal end ECK and the second clock signal end ECB are at high level. When the first clock signal end ECK and the second clock signal end ECB are at high level, each transistor is turned off, so that the fourth node N4 and the fifth node N5 may keep the previous level state respectively, and the shift register may keep a stable low level output.

In an exemplary embodiment, the quantity of time at which one of the first clock signal end ECK and the second clock signal end ECB, which has an ascending level, is changed "ahead" of the other clock signal end may be $1/15$ to $6/15$ of a clock signal period. The clock signal period refers to a total duration of one high level and one low level which are adjacent in a clock signal.

Under the same conditions of the signal input end ESTV, the first clock signal end ECK, the second clock signal end ECB, the first power supply end VGL, and a second power supply end VGH, simulation experiments are respectively carried out on the shift registers shown in FIGS. 1 and 8, and the simulation experiment results are as follows.

When load capacitance of the output end EOUT is 1 pF, an output signal of the output end EOUT of the shift register shown in FIG. 1 fluctuates in a low level segment. The output signal of the output end EOUT of the shift register shown in FIG. 8 does not fluctuate in the low level segment, but keeps a stable low level output.

When the load capacitance of the output end EOUT is 0, 10 fF, 1 pF, and 100 pF respectively, an output signal of the output end EOUT of the shift register shown in FIG. 1 obviously changes along with the load change under different load capacitances. The output signal of the output end EOUT of the shift register shown in FIG. 8 has no obvious fluctuation in the low level segment under the condition that the load capacitance is different in the low level segment, and the stable low level output is kept.

A drive circuit composed of the shift register shown in FIG. 1 and a drive circuit composed of the shift register shown in FIG. 8 are respectively applied to OLED display panels. When the load capacitance of the output ends of both of them is 1 pF, the current fluctuation of an OLED device is large in the display panel adopting the shift register shown in FIG. 1, and the current fluctuation of an OLED device is not obvious in the display panel adopting the shift register shown in FIG. 8.

In the shift register provided by the embodiments of the present disclosure, the output signal of the output end is not influenced by a load size of the output end, no matter the load size of the output end, the output end can output stable signals, low level pulse fluctuations will not be generated, and the display image quality of the display device is improved.

In the shift register provided by the embodiments of the present disclosure, the output signal of the output end is more stable in low level segments, so that the shift register can provide more stable output currents to, for example, an anisotropic panel, a panel with an display region opening, or an extremely narrow panel with a smaller load in the display region, and the display image quality of the display devices is improved.

In an exemplary embodiment, in the shift register shown in FIG. 8, transistors T1 to T11 may all be N-type transistors. When N-type transistors are employed, states of the first power supply end VGL, the second power supply end VGH, the signal input end ESTV, the first clock signal end ECK, and the second clock signal end ECB are opposite to those when P-type transistors are employed.

In an exemplary embodiment, each of the transistors T1 to T11 may be an N-type thin film transistor or a P-type thin film transistor, so that the process flow can be unified, the process flow can be reduced, and the product yield can be improved. In addition, considering that a leakage current of a low-temperature polycrystalline silicon thin film transistor is small, all the transistors in the embodiments of the present disclosure may be low-temperature polycrystalline silicon thin film transistors. A thin film transistor may be selected as a thin film transistor with a bottom gate structure or a thin film transistor with a top gate structure as long as it can realize a switching function.

In an exemplary embodiment, the first capacitor C1, the second capacitor C2, and the third capacitor C3 may be parasitic capacitors of the transistors or may be external capacitors, which are not limited in the embodiments of the present disclosure.

Figure 14:
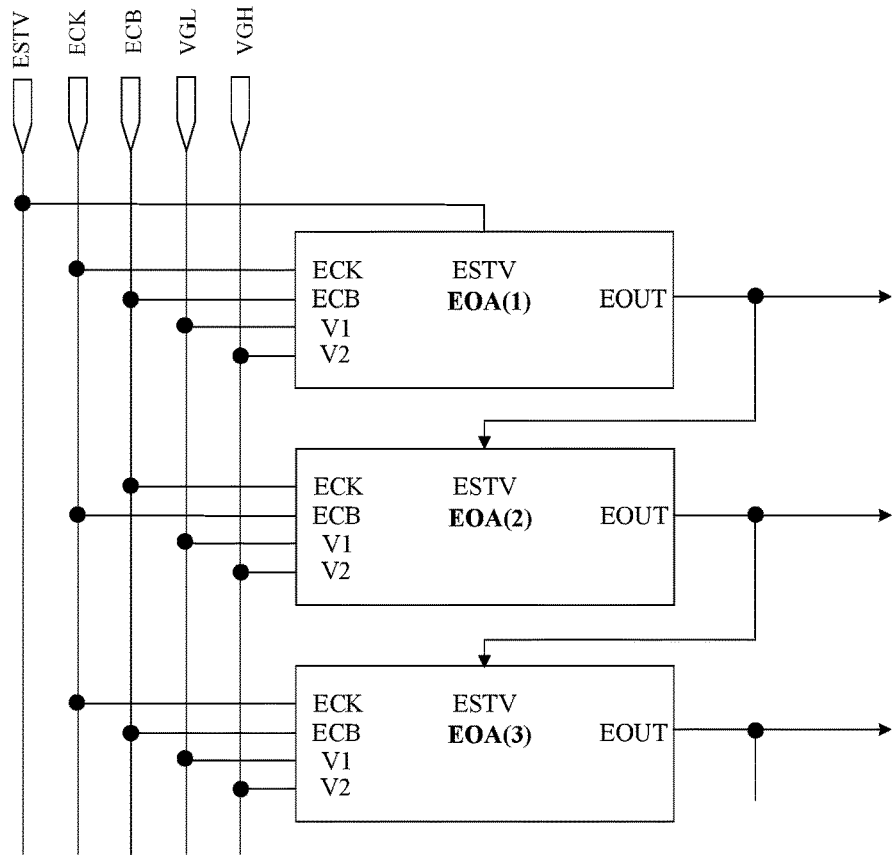
FIG. 14 is a schematic diagram of a drive circuit in an exemplary embodiment of the present disclosure.

An embodiment of the present disclosure provides a drive circuit. FIG. 14 is a schematic diagram of a drive circuit in an exemplary embodiment of the present disclosure. As shown in FIG. 14, the drive circuit includes multiple cascaded shift registers as described above. A signal input end ESTV of a first-stage shift register EOA (1) is connected to an enable signal line ESTV, a signal input end of an $n^{th}$-stage shift register EOA (n) is connected to an output end EOUT of an $n-1^{th}$-stage shift register EOA (n-1). n is a positive integer greater than or equal to 2. First power supply end VGL and second power supply end VGH of each of the shift registers are respectively connected to a first power supply line VGL and a second power supply line VGH. A first clock signal end ECK and a second clock signal end ECB of each odd-stage shift register EOA are all respectively connected to a first clock signal line ECK and a second clock signal line ECB, and a first clock signal end ECK and a second clock signal end ECB of each even-stage shift register EOA are all respectively connected to the second clock signal line ECB and the first clock signal line ECK.

Figure 19:
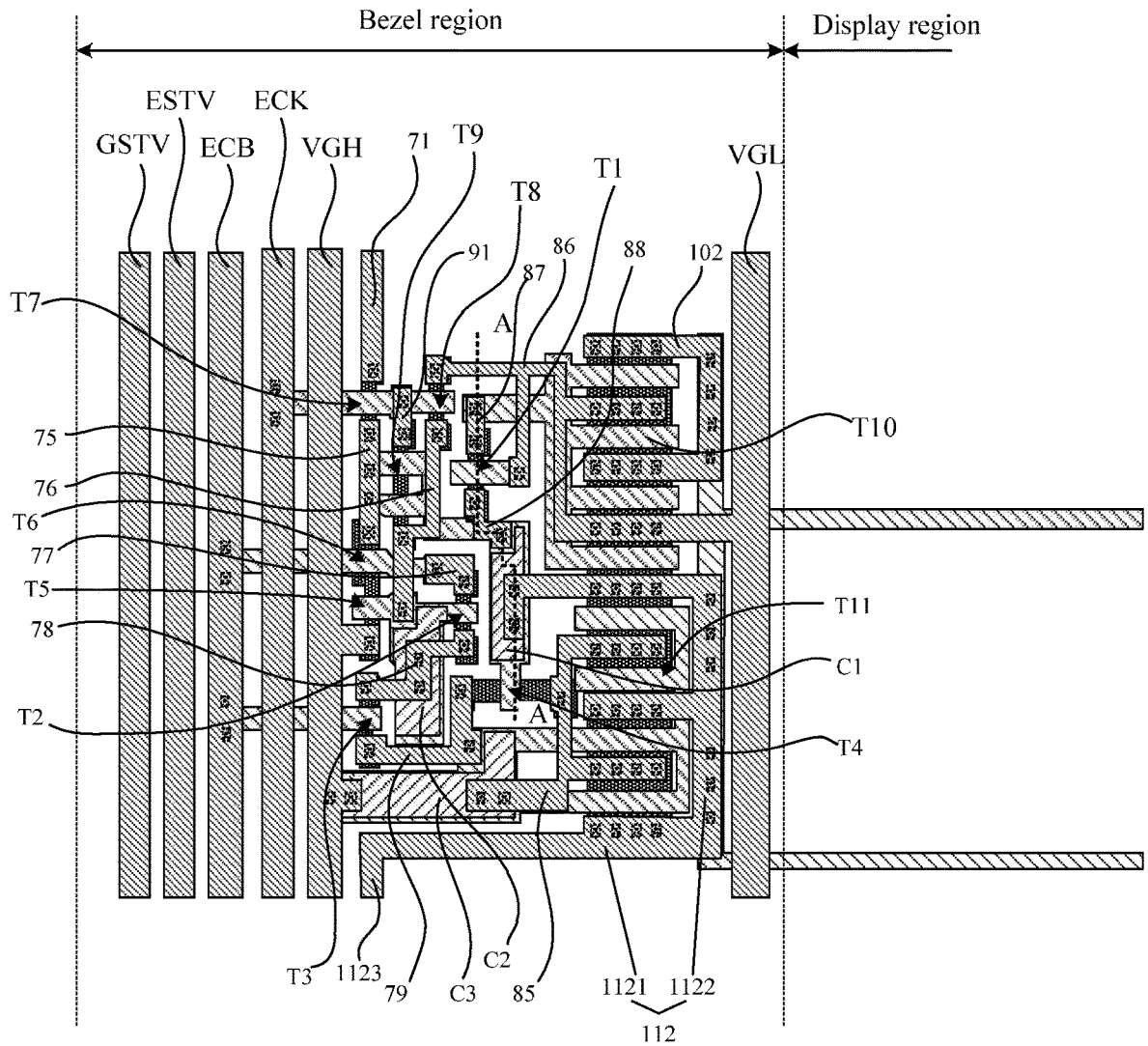
FIG. 19 is a schematic diagram of a display substrate in an exemplary embodiment of the present disclosure.
Figure 20:
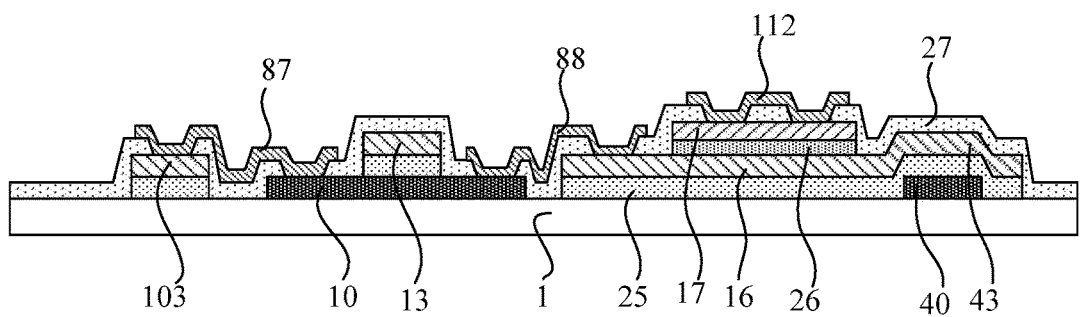
FIG. 20 is a schematic diagram of cross-section along A-A in FIG. 10.

In another aspect, an embodiment of the present disclosure further provides a display substrate. FIG. 19 is a schematic top view of a display substrate in an exemplary embodiment of the present disclosure. FIG. 20 is a schematic diagram of cross-section along A-A in FIG. 19. As shown in FIGS. 19 and 20, the display substrate includes a display region and a bezel region at the periphery of the display region. The display substrate adopts the drive circuit as described above. The drive circuit is located in the bezel region. In the bezel region, the display substrate includes:
  a base substrate;
  an oxide semiconductor layer, located on a side of the base substrate and including a first active layer of a first transistor;
  a first insulating layer, located on a side of the oxide semiconductor layer facing away from the base substrate;
  a first metal layer, located on a side of the first insulating layer facing away from the base substrate and including a first gate electrode and a first plate of the first transistor;
  a second insulating layer, located on a side of the first metal layer facing away from the base substrate;
  a second metal layer, located on a side of the second insulating layer facing away from the base substrate and including a second plate, wherein an orthographic projection of the second plate on the base substrate is within the range of an orthographic projection of the first plate on the base substrate, and the second plate and the first plate form a first capacitor;
  a third insulating layer, located on a side of the second metal layer facing away from the base substrate, and provided with a first via hole and a second via hole for exposing the first active layer, a fourth via hole for exposing the first plate, and a fifth via hole for exposing the second plate; and
  a third metal layer, located on a side of the third insulating layer facing away from the base and including an eighth metal strip and an eleventh drain electrode, wherein the eighth metal strip is connected to the first active layer through the second via hole and connected to the first plate through the fourth via hole, and the eleventh drain electrode is connected to the second plate through the fifth via hole.

In an exemplary embodiment, the oxide semiconductor layer further includes a fourth active layer of a fourth transistor. The first metal layer further includes a tenth gate electrode of a tenth transistor and a fourth gate electrode of the fourth transistor, wherein the fourth gate electrode and the first plate are of an integral structure. The third insulating layer is provided with a thirty-seventh via hole for exposing the tenth gate electrode. The third metal layer further comprises a seventh metal strip, wherein the seventh metal strip is connected to the tenth gate electrode through the thirty-seventh via hole, and the seventh metal strip is connected to the first active layer through the first via hole.

In an exemplary embodiment, the oxide semiconductor layer further includes a second active layer of a second transistor, a third active layer of a third transistor, a fourth active layer of the fourth transistor, a fifth active layer of a fifth transistor, a sixth active layer of a sixth transistor, a seventh active layer of a seventh transistor, an eighth active layer of an eighth transistor, a ninth active layer of a ninth transistor, a tenth active layer of the tenth transistor, and an eleventh active layer of an eleventh transistor. The tenth active layer and the eleventh active layer are of an integral structure, wherein the tenth active layer is arranged in a first direction. The first active layer, the second active layer, the third active layer, the fourth active layer, the fifth active layer, the sixth active layer, the seventh active layer, the eighth active layer, and the ninth active layer are all located on a side of the tenth active layer away from the display region. The fifth active layer and the sixth active layer are of an integral structure. The first active layer, the second active layer, the third active layer, the fifth active layer, the sixth active layer, the seventh active layer, the eighth active layer, and the ninth active layers are all arranged in the first direction, wherein the first direction is a direction parallel to an extending direction of the bezel region.

The third metal layer further includes an enable signal line, a second clock signal line, a first clock signal line, a second power supply line, and a first power supply lin. The enable signal line, the second clock signal line, the first clock signal line, and the second power supply line are all arranged in the first direction, the enable signal line, the second clock signal line, the first clock signal line, and the second power supply line are successively closer to the display region, and are all located on a side of the oxide semiconductor layer facing away from the display region, and the first power supply line is located on a side of the oxide semiconductor layer facing the display region.

The structure of the display substrate is described below by way of an example of a manufacturing process of the display substrate. "Patterning process" of the embodiments of the present disclosure includes any one or more of the following: depositing a film layer, coating a photoresist, exposing a mask, developing, etching, and stripping the photoresist. The deposition may be by any one or more of sputtering, evaporation, and chemical vapor deposition, the coating may be by any one or more of spraying and spin coating, and the etching may be by any one or more of dry etching and wet etching. "Thin film" refers to a thin film made of a material on a base substrate using a deposition or coating process. If the "thin film" does not require a patterning process throughout the manufacturing process, the "thin film" may be referred to as a "layer". If the "thin film" requires a patterning process throughout the manufacturing process, it is referred to as a "thin film" before the patterning process and a "layer" after the patterning process. The "layer" after the patterning process includes at least one "pattern". "A and B are configured on the same layer" in the embodiments of the present disclosure, refers to that A and B are formed simultaneously by a same patterning process.

FIGS. 15-20 are schematic diagrams of a manufacturing process of a display substrate in an exemplary embodiment of the present disclosure. For ease of description, a "gate electrode" is used herein to refer to a control electrode of each transistor, a "source electrode" is used to refer to a first electrode of each transistor, and a "drain electrode" is used to refer to a second electrode of each transistor. An $m^{th}$ gate electrode is a gate electrode of an $m^{th}$ transistor, an $m^{th}$ source electrode is a first electrode of the $m^{th}$ transistor, and an $m^{th}$ drain electrode is a second electrode of the $m^{th}$ transistor, wherein m has a value of an integer of 1 to 11.

Figure 15A:
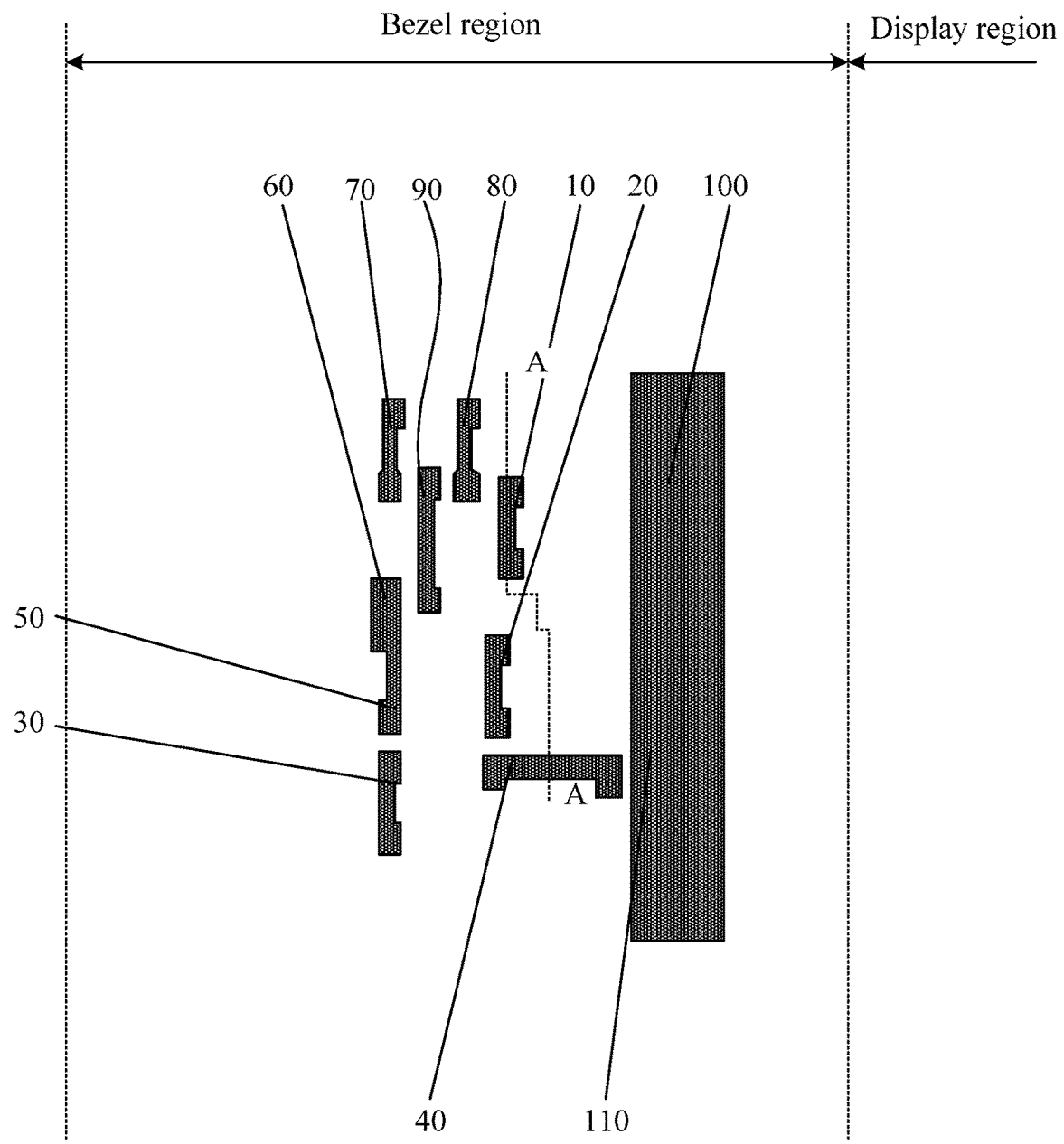
FIG. 15a is a schematic diagram of a display substrate after a pattern of a semiconductor layer is formed in an exemplary embodiment of the present disclosure.
Figure 15B:
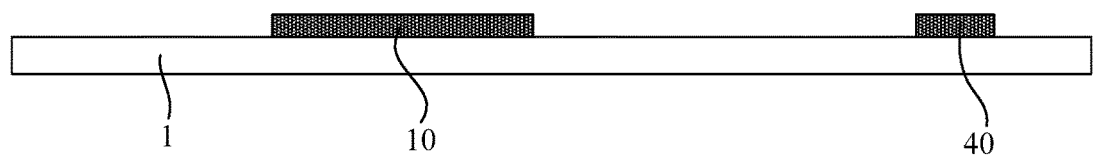

(1) A pattern of a semiconductor layer is formed. The step may include: depositing a semiconductor thin film on a base substrate, and patterning the semiconductor thin film through a patterning process to form a pattern of a semiconductor layer, for example, as shown in FIGS. 15a and 15b. FIG. 15a is a schematic diagram of a display substrate after the pattern of the semiconductor layer is formed in an exemplary embodiment of the present disclosure. FIG. 15b is a schematic diagram of cross-section along A-A in FIG. 15a.

As shown in FIGS. 15a and 15b, the semiconductor layer includes a first active layer 10 of a first transistor T1, a second active layer 20 of a second transistor T2, a third active layer 30 of a third transistor T3, a fourth active layer 40 of a fourth transistor T4, a fifth active layer 50 of a fifth transistor T5, a sixth active layer 60 of a sixth transistor T6, a seventh active layer 70 of a seventh transistor T7, an eighth active layer 80 of an eighth transistor T8, a ninth active layer 90 of a ninth transistor T9, a tenth active layer 100 of a tenth transistor T10, and an eleventh active layer 110 of an eleventh transistor T11.

In an exemplary embodiment, the fourth active layer 40 may extend in a second direction (e.g., a horizontal direction) and other active layers may extend in a first direction (e.g., a vertical direction). The fifth active layer 50 and the sixth active layer 60 are of an integral structure, and the tenth active layer 100 and the eleventh active layer 110 are of an integral structure which is in a strip shape. In the second direction (i.e., the horizontal direction), the first active layer 10, the second active layer 20, the third active layer 30, the fourth active layer 40, the fifth active layer 50, the sixth active layer 60, the seventh active layer 70, the eighth active layer 80, and the ninth active layer 90 are all located on a same side of the tenth active layer 100. The first active layer 10 is located between the ninth active layer 90 and the tenth active layer 10, and the eighth active layer 80 is located between the first active layer 10 and the ninth active layer 90.

Figure 16A:
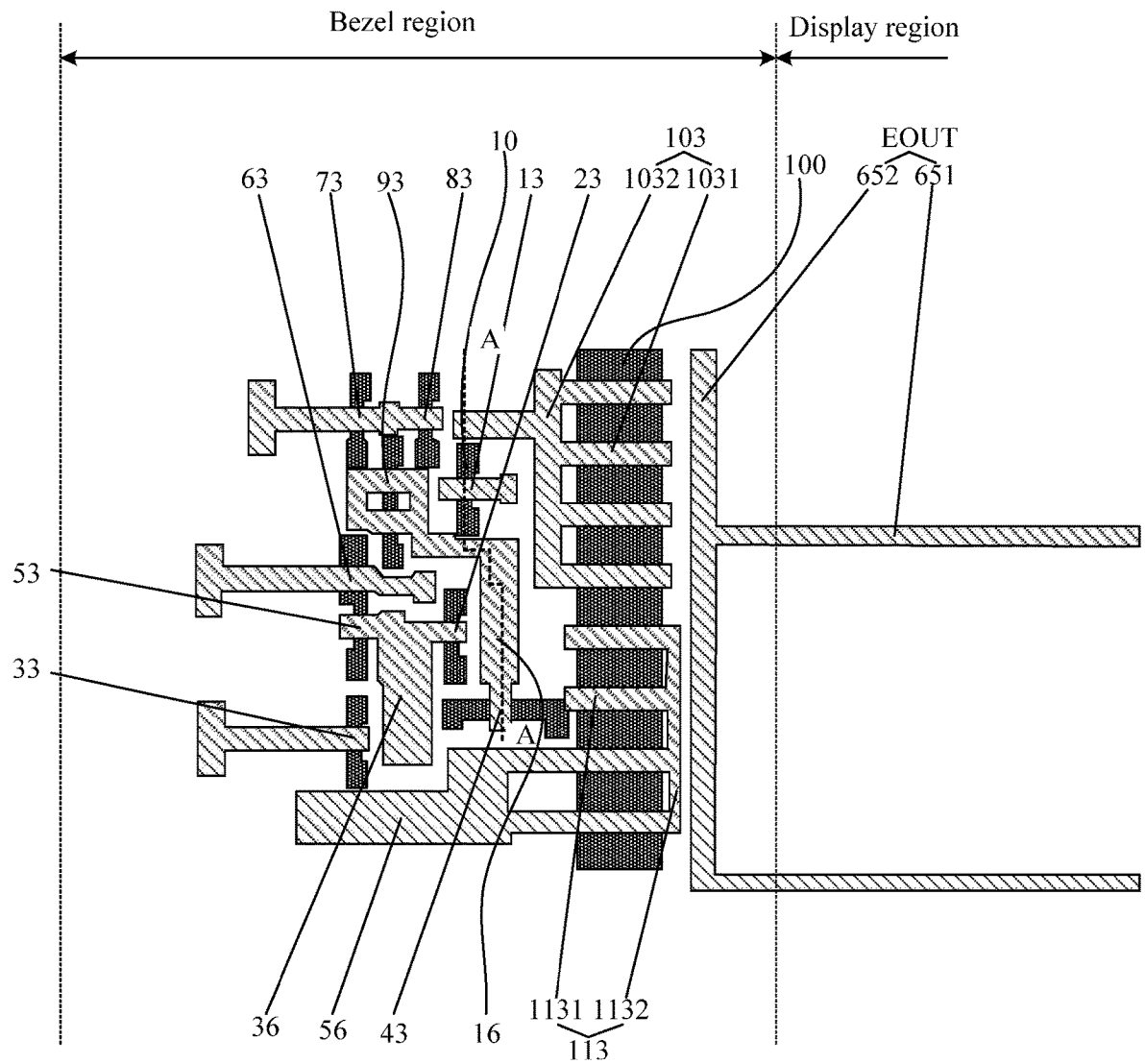
FIG. 16a is a schematic diagram of a display substrate after a pattern of a first metal layer is formed in an exemplary embodiment of the present disclosure.
Figure 16B:
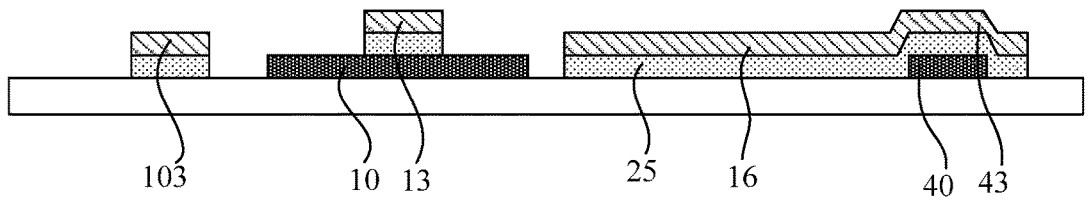

(2) A pattern of a first metal layer is formed. The step may include: depositing a first insulating thin film and a first metal thin film sequentially on the base substrate with the foregoing pattern formed, and patterning the first insulating thin film and the first metal thin film through a patterning process to form a pattern of a first insulating layer 25 and a pattern of a first metal layer on the first insulating layer 25. An orthographic projection of the first insulating layer 25 on the base substrate 1 and an orthographic projection of the first metal layer on the base substrate 1 coincide, for example, as shown in FIGS. 16a and 16b. FIG. 16a is a schematic diagram of a display substrate after the pattern of the first metal layer is formed in an exemplary embodiment of the present disclosure. FIG. 16b is a schematic diagram of cross-section along A-A in FIG. 16a.

As shown in FIGS. 16a and 16b, the pattern of the first metal layer includes a first gate electrode 13 of a first transistor, a second gate electrode 23 of a second transistor, a third gate electrode 33 of a third transistor, a fourth gate electrode 43 of a fourth transistor, a fifth gate electrode 53 of a fifth transistor, a sixth gate electrode 63 of a sixth transistor, a seventh gate electrode 73 of a seventh transistor, an eighth gate electrode 83 of an eighth transistor, a ninth gate electrode 93 of a ninth transistor, a tenth gate electrode 103 of a tenth transistor, and an eleventh gate electrode 113 of an eleventh transistor. Each gate electrode is provided across the active layer of a corresponding transistor, that is, an extending direction of each gate electrode is perpendicular to an extending direction of the active layer of the corresponding transistor.

In an exemplary embodiment, the ninth gate electrode 93 is in a hollow-square structure. The tenth gate electrode 103 has a comb-like structure, that is, the tenth gate electrode 103 includes multiple first branch segments 1031 provided across the tenth active layer and a first connection segment 1032 connected to the multiple first branch segments 1031. The eleventh gate electrode 113 has a comb-like structure, that is, the eleventh gate electrode 113 includes multiple second branch segments 1131 provided across the eleventh active layer and a second connection segment 1132 connected to the multiple second branch segments 1131. The seventh gate electrode 73 and the eighth gate electrode 83 are of an integral structure.

In an exemplary embodiment, the pattern of the first metal layer further includes a first plate 16, a third plate 36, and a fifth plate 56. The first plate 16 is located between the second active layer and the eleventh active layer, and the first plate 16 has an elongated shape extending in the first direction. The first plate 16 is connected to the ninth gate electrode 93 and the fourth gate electrode 43, and the first plate 16, the ninth gate electrode 93 and the fourth gate electrode 43 may be of an integral structure. The first plate 16 may serve as one plate of a first capacitor C1. The third plate 36 is located between the fifth active layer and the second active layer, and the third plate 36, the fifth gate electrode 53 and the second gate electrode 23 are of an integral structure. The third plate 36 has an elongated shape extending in the first direction. The third plate 36 may serve as one plate of a second capacitor C2. The fifth plate 56 is connected to the eleventh gate electrode 113, and the fifth plate 56 and the eleventh gate electrode 113 are of an integral structure. The fifth plate 56 has an elongated shape extending in the second direction. The fifth plate 56 may serve as one plate of a third capacitor C3.

In an exemplary embodiment, the pattern of the first metal layer may further include an output line EOUT. The output line EOUT may include two third branch segments 651 extending in the second direction and a third connection segment 652 connected to the two third branch segments 651, wherein the third connection segment 652 extends in the first direction. In a direction perpendicular to the substrate, the output line EOUT is located on a side of the tenth active layer 100 facing away from the first active layer 10.

In an exemplary embodiment, the process may further include a conducting process. The conducting process is as follows: after forming the pattern of the first metal layer, the first gate electrode 13, the second gate electrode 23, the third gate electrode 33, the fourth gate electrode 43, the fifth gate electrode 53, the sixth gate electrode 63, the seventh gate electrode 73, the eighth gate electrode 83, the nine gate electrode 93, the tenth gate electrode 103, and the eleventh gate electrode 113 are used to shield a semiconductor layer of a region (i.e., a region where the semiconductor layer overlaps each gate electrode) as a channel region of the transistor, and a semiconductor layer of the region not shielded by the first metal layer is processed into a conducting layer to form a conducting source and drain region.

Figure 17A:
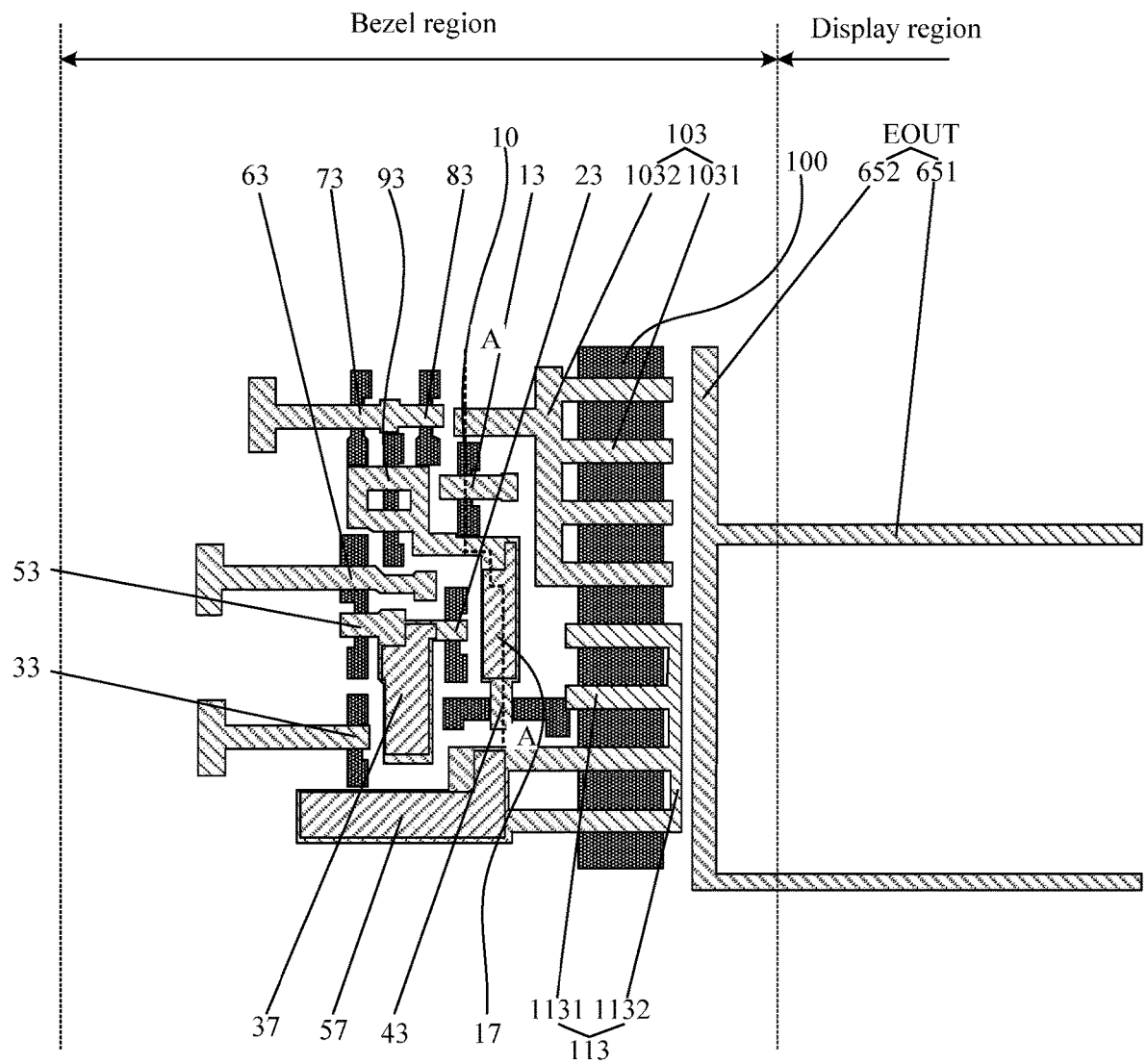
FIG. 17a is a schematic diagram of a display substrate after forming a pattern of a second metal layer is formed in an exemplary embodiment of the present disclosure.
Figure 17B:
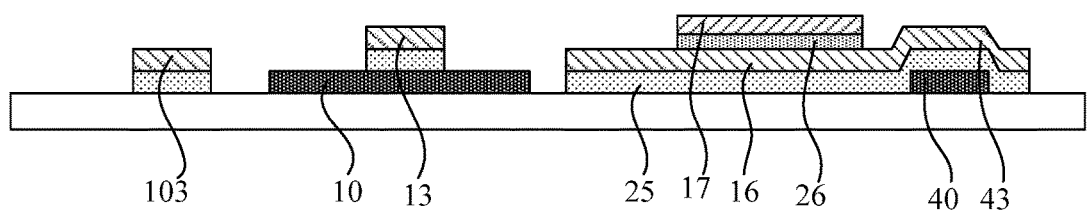

(3) A pattern of a second metal layer is formed. The step may include: depositing a second insulating thin film and a second metal thin film sequentially on the base substrate with the foregoing patterns formed, and patterning the second insulating thin film and the second metal thin film through a patterning process to form a pattern of a second insulating layer 26 and a pattern of a second metal layer on the second insulating layer 26. An orthographic projection of the second insulating layer 26 on the base substrate 1 and an orthographic projection of the second metal layer on the base substrate 1 coincide, for example, as shown in FIGS. 17a and 17b. FIG. 17a is a schematic diagram of a display substrate after the pattern of the second metal layer is formed in an exemplary embodiment of the present disclosure. FIG. 17b is a schematic diagram of cross-section along A-A in FIG. 17a.

As shown in FIGS. 17a and 17b, the second metal layer may include a second plate 17, a fourth plate 37, and a sixth plate 57. The second plate 17 is located above the first plate 17, the fourth plate 37 is located above the third plate 36, and the sixth plate 57 is located above the fifth plate 56. An orthographic projection of the second plate 17 on the base substrate 1 is within the range of an orthographic projection of the first plate 16 on the base substrate 1. An orthographic projection of the fourth plate 37 on the base substrate 1 is within the range of an orthographic projection of the third plate 36 on the base substrate 1. An orthographic projection of the sixth plate 57 on the base substrate 1 is within the range of an orthographic projection of the fifth plate 56 on the base substrate 1. The first plate 16 and the second plate 17 form the first capacitor C1, the third plate 36 and the fourth plate 37 form the second capacitor C2, and the fifth plate 56 and the sixth plate 57 form the third capacitor C3.

Figure 18A:
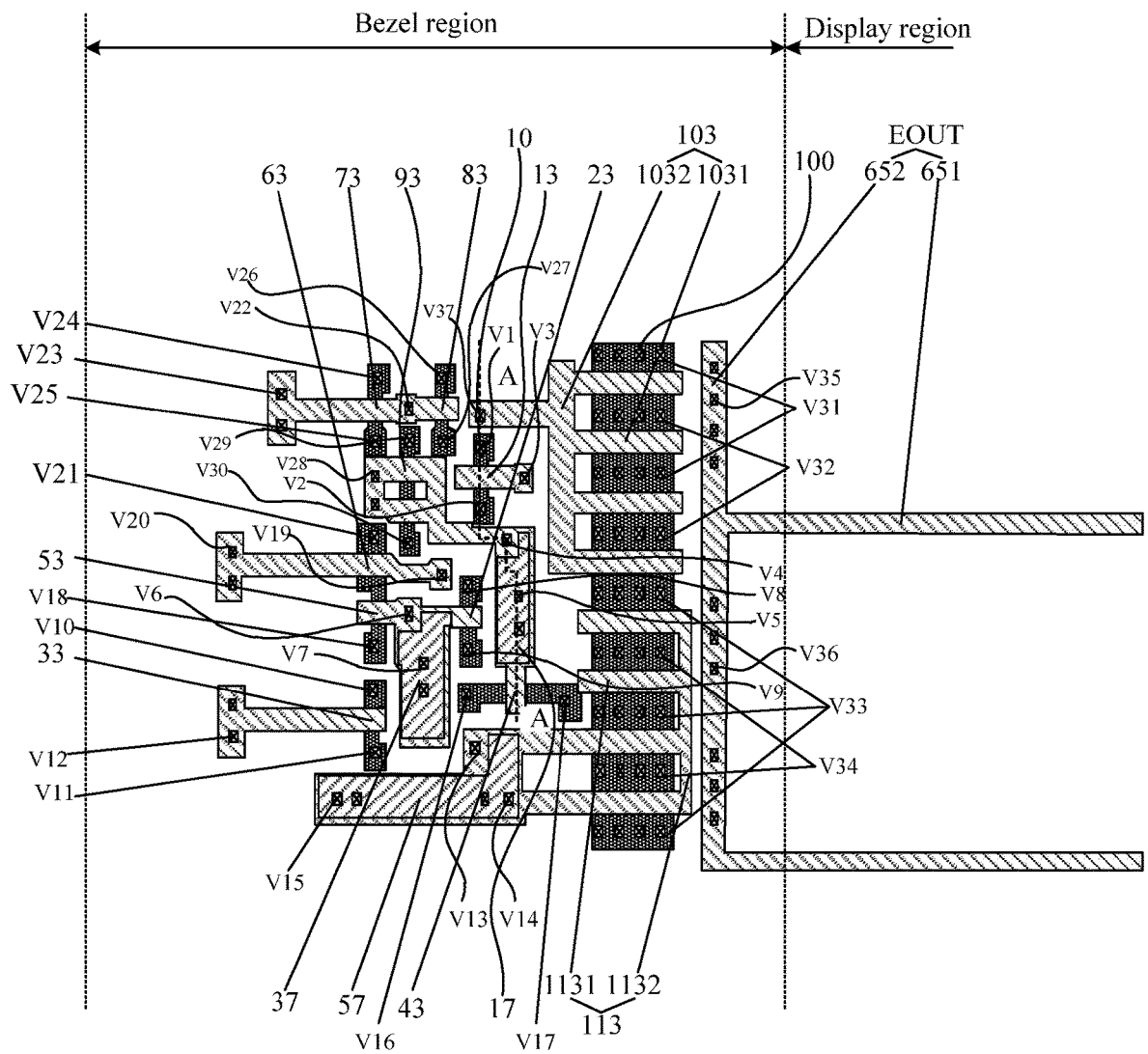
FIG. 18a is a schematic diagram of a display substrate after a pattern of a third insulating layer is formed in an exemplary embodiment of the present disclosure.
Figure 18B:
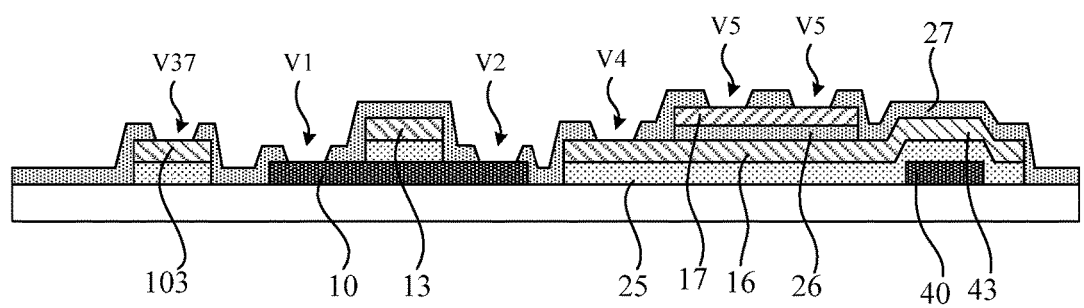

(4) A pattern of a third insulating layer is formed. The step may include: depositing a third insulating thin film on the base substrate with the foregoing patterns formed, and patterning the third insulating thin film through a patterning process to form a pattern of a third insulating layer 27 covering the foregoing structure. The third insulating layer 27 is provided with a pattern of multiple via holes, for example, as shown in FIGS. 18a and 18b. FIG. 18a is a schematic diagram of a display substrate after a pattern of a third insulating layer is formed in an exemplary embodiment of the present disclosure. FIG. 18b is a schematic diagram of cross-section along A-A in FIG. 18a.

As shown in FIGS. 18a and 18b, the pattern of the multiple via holes may include: a first via hole V1 and a second via hole V2 on two sides of the first gate electrode 13, a third via hole V3 on the first gate electrode 13, a fourth via hole V4 on the first plate 16, a fifth via hole V5 on the second plate 17, a sixth via hole V6 on the third plate 36, a seventh via hole V7 on the fourth plate 37, an eighth via hole V8 and a ninth via hole V9 on two sides of the second gate electrode 23, a tenth via hole V10 and an eleventh via hole V11 on two sides of the third gate electrode 33, a twelfth via hole V12 on the third gate electrode 33, a thirteenth via hole V13 on the fifth plate 56, two fourteenth via holes V14 and two fifteenth via holes V15 on the sixth plate 57, a sixteenth via hole V16 and a seventeenth via hole V17 on two sides of the fourth gate electrode 43, an eighteenth via hole V18 on the lower side of the fifth gate electrode 53, a nineteenth via hole V19 and a twentieth via hole V20 on the sixth gate electrode 63, a twenty-first via hole V21 on the upper side of the sixth gate electrode 63, a twenty-second via hole V22 and a twenty-third via hole V23 on the seventh gate electrode 73, a twenty-fourth via hole V24 and a twenty-fifth via hole V25 on two sides of the seventh gate electrode 73, a twenty-sixth via hole V26 and a twenty-seventh via hole V27 on two sides of the eighth gate electrode 83, a twenty-eighth via hole V28 on the ninth gate electrode 93, a twenty-ninth via hole V29 and a thirtieth via hole V30 on two sides of the ninth gate electrode 93, a thirty-first via hole V31 and a thirty-second via hole V32 on two sides of a first branch segment 1031 of the tenth gate electrode 103, a thirty-third via hole V33 and a thirty-fourth via hole V34 on two sides of a second branch segment 1131, a thirty-fifth via hole V35 and a thirty-sixth via hole V36 on the third connection segment 652 of the output line EOUT, and a thirty-seventh via hole V37 on the tenth gate electrode 103.

(4) A pattern of a third metal layer is formed. The step may include: depositing a third metal thin film on the base substrate with the foregoing patterns formed, and patterning the third metal thin film through a patterning process to form a pattern of a third metal layer, for example, as shown in FIGS. 19 and 20. FIG. 19 is a schematic diagram of a display substrate in an exemplary embodiment of the present disclosure. FIG. 20 is a schematic diagram of cross-section along A-A in FIG. 10.

As shown in FIGS. 19 and 20, the pattern of the third metal layer may include a gate signal line GSTV, an enable signal line ESTV, a second clock signal line ECB, a first clock signal line ECK, a second power supply line VGH, and a first power supply line VGL. The gate signal line GSTV, the enable signal line ESTV, the second clock signal line ECB, the first clock signal line ECK, and the second power supply line VGH are arranged in parallel and all extend in the first direction. The gate signal line GSTV, the enable signal line ESTV, the second clock signal line ECB, the first clock signal line ECK, and the second power supply line VGH are all located on a side of the active layer of transistor facing away from the output line EOUT, that is, the gate signal line GSTV, the enable signal line ESTV, the second clock signal line ECB, the first clock signal line ECK, and the second power supply line VGH may all be located on the left side of the active layer of the transistor, and the output line EOUT is located on the right side of the active layer of the transistor. The gate signal line GSTV, the enable signal line ESTV, the second clock signal line ECB, the first clock signal line ECK, and the second power supply line VGH are successively closer to the output line EOUT. The first power supply line VGL extends in the first direction, and the first power supply line VGL is located on a side of the third connection segment 652 of the output line EOUT facing away from the second power supply line VGH.

In an exemplary embodiment, the pattern of the third metal layer may further include a seventh source electrode 71, a first metal strip 75, a ninth source electrode 91, a second metal strip 76, a third metal strip 77, a fourth metal strip 78, a fifth metal strip 79, a sixth metal strip 85, an eleventh drain electrode 112, a first power patch 86, a tenth drain electrode 102, a seventh metal strip 87, and an eighth metal strip 88.

In an exemplary embodiment, the seventh source electrode 71 may be connected to the seventh active layer through the twenty-fourth via hole V24. The seventh source electrode 71 may serve as the signal input end ESTV of the shift register. An upper end of the first metal strip 75 is a seventh drain electrode, a lower end of the first metal strip is a sixth drain electrode, the upper end of the first metal strip 75 is connected to the seventh active layer through the twenty-fifth via hole, and the lower end of the first metal strip 75 is connected to the sixth active layer through the twenty-first via hole. A middle segment of the first metal strip 75 is connected to the ninth gate electrode through the twenty-eighth via hole. The ninth source electrode 91 is connected to the seventh gate electrode 73 and the ninth active layer 90 through the twenty-second via hole V22 and the twenty-ninth via hole V29 respectively. An upper end of the second metal strip 76 may be an eighth drain electrode, a middle segment of the second metal strip 76 may be a ninth drain electrode, the upper end of the second metal strip 76 is connected to the eighth active layer through the twenty-seventh via hole V27, a middle position of the second metal strip 76 is connected to the ninth active layer through the thirtieth via hole V30, and a lower end of the second metal strip 76 is connected to the third plate 36 through the sixth via hole. One end of the third metal strip 77 may be a second source electrode, the third metal strip 77 is connected to the sixth gate electrode 63 through the nineteenth via hole V19, and the second source electrode is connected to the second active layer through the eighth via hole V8. One end of the fourth metal strip 78 serves as a second drain electrode and is connected to the second active layer through the ninth via hole V9, a middle position of the fourth metal strip 78 is connected to the fourth plate 37 through the seventh via hole V7, and the other end of the fourth metal strip 78 serves as a third source electrode and is connected to the third active layer through the tenth via hole V10. One end of the fifth metal strip 79 serves as a third drain electrode and is connected to the third active layer through the eleventh via hole V11. A middle position of the fifth metal strip 79 is connected to the fifth plate 56 through the thirteenth via hole V13. The other end of the fifth metal strip 79 serves as a fourth drain electrode and is connected to the fourth active layer through the sixteenth via hole V16. One end of the sixth metal strip 85 is connected to the sixth plate 57 through the fourteenth via hole. A middle position of the sixth metal strip 85 may serve as a fourth source electrode and be connected to the fourth active layer through the seventeenth via hole. The other end of the sixth metal strip 85 may serve as an eleventh source electrode layer and be connected to the eleventh active layer through multiple thirty-fourth via holes. The eleventh drain electrode 112 includes three fourth branch segments 1121 arranged in the second direction and a fourth connection segment 1122 connected to the three fourth branch segments 1121, wherein the fourth connection segment 1122 is arranged in the first direction. The fourth branch segments 1121 are connected to the eleventh active layer through the thirty-third via holes, and the fourth connection segment 1122 is connected to the output line EOUT through the thirty-sixth via hole. A fourth branch segment 1121 at the lower side has a vertical segment 1123 extending downwards in the first direction. The vertical segment 1123 may be connected to a signal input end of the next-stage shift register (i.e. the seventh source electrode 71). A fourth branch segment 1121 at the upper side is connected to the second plate 17 through the fifth via hole V5. A first power patch cord 86 and the first power supply line VGL are of an integral structure, wherein the first power patch cord 86 is provided with multiple branch segments. One end of the first power patch cord 86 serves as an eighth active layer and is connected to the eighth active layer through the twenty-sixth via hole V26, the first power patch cord 86 is connected to the first gate electrode 13 through the third via hole V3, and a portion of the first power patch cord 86 serves as the tenth source electrode and is connected to the tenth active layer through the thirty-second via hole V32. The tenth drain electrode 102 is connected to the tenth active layer through the thirty-first via hole V31, and the tenth drain electrode 102 is connected to the output line EOUT through multiple thirty-fifth via holes V35. A lower end of the seventh metal strip 87 may serve as a first drain electrode and is connected to the first active layer through the first via hole V1, and the seventh metal strip 87 is also connected to the tenth gate electrode 103 through the thirty-seventh via hole V37. One end of the eighth metal strip 88 may serve as a first source electrode and is connected to the first active layer through the second via hole V2, and the other end of the eighth metal strip 88 is connected to the first plate 16 through the fourth via hole V4.

In an exemplary embodiment, the second clock signal line ECB may be connected to the sixth gate electrode 63 through the twelfth via hole V20, and the second clock signal line ECB may be connected to the third gate electrode 33 through the twelfth via hole V12. The second power supply line VGH may be connected to the sixth plate 57 through the fifteenth via hole V15.

In some exemplary embodiments, the first metal layer, the second metal layer, and the third metal layer may be made of a metal material, such as any one or more of silver (Ag), copper (Cu), aluminum (Al), and molybdenum (Mo), or an alloy material of the above metals, such as aluminum neodymium alloy (AlNd) or molybdenum niobium alloy (MoNb), which may be in a single-layer structure, or a multi-layer composite structure such as Mo/Cu/Mo. The first insulating layer, the second insulating layer, and the third insulating layer may be any one or more of silicon oxide (SiOx), silicon nitride (SiNx), and silicon oxynitride (SiON), and may be in a single layer, multiple layers, or a composite layer.

In some exemplary embodiments, a material of the active layer may be metal oxide, or low temperature polycrystalline silicon, amorphous silicon, microcrystalline silicon, or the like.

An embodiment of the present disclosure further provides a display device including a display panel or drive circuit employing the foregoing embodiments. The display device may be: any product or component with a display function, such as a mobile phone, a tablet computer, a television, a display, a laptop computer, a digital photo frame, or a navigator.

Although the present disclosure discloses the above implementations, the content is only the implementations adopted for convenience of understanding the present disclosure, and is not intended to limit the present disclosure. Any person skilled in the art to which the present disclosure pertains may make modifications and variations in implementation forms and details without departing from the essence and scope of the present disclosure, but the scope of patent protection of the present disclosure should still be determined by the scope of the appended claims.

What is claimed is:

1. A shift register, comprising: an input unit, a first control unit, a second control unit, an output unit, and a voltage stabilizing unit,
    wherein the input unit is respectively connected to a signal input end, a first power supply end, a first clock signal end, a first node, and a second node, and is configured to provide a signal of the signal input end to the first node and provide a signal of the first power supply end to the second node under control of the first clock signal end;
    the first control unit is respectively connected to the first node, the second node, a fourth node, a second power supply end, and a second clock signal end, and is configured to control a signal of the fourth node according to the signals of the first node and the second node;
    the second control unit is respectively connected to the first node, the second node, the second power supply end, and the second clock signal end, and is configured to provide a signal of the second power supply end to the first node under control of the second node and the second clock signal end;
    the output unit is respectively connected to the fourth node, a fifth node, the first power supply end, the second power supply end, and an output end, and is configured to provide the signal of the second power supply end or the first power supply end to the output end under control of the fourth node and the fifth node; and
    the voltage stabilizing unit is respectively connected to the first node, the fifth node, the output end, and the first power supply end, and is configured to keep the signal of the output end stable when the output unit provides the signal of the first power supply end to the output end;
    wherein the input unit is connected to the first control unit and the second control unit through the first node and the second node;
    the first control unit is connected to the second control unit through the first node and the second node, and connected to the output unit through the fourth node;
    the voltage stabilizing unit is connected to the input unit, the first control unit and the second control unit through the first node, connected to the output unit through the fifth node, and connected to the output end of the output unit.

2. The shift register according to claim 1, wherein the voltage stabilizing unit comprises a first transistor and a first capacitor;
    the first transistor has a control electrode connected to the first power supply end, a first electrode connected to the first node, and a second electrode connected to the fifth node; and
    the first capacitor has a first electrode connected to the first node, and a second electrode connected to the output end.

3. The shift register according to claim 1, wherein the voltage stabilizing unit comprises a first capacitor, the first capacitor has a first electrode connected to the first node, a second electrode connected to the output end, and the fifth node connected to the first node.

4. The shift register according to claim 1, wherein the first control unit comprises a second transistor, a third transistor, a fourth transistor, a second capacitor, and a third capacitor,
    wherein the second transistor has a control electrode connected to the second node, a first electrode connected to the second clock signal end, and a second electrode connected to a third node;
    the second capacitor has a first electrode connected to the second node, and a second electrode connected to the third node; the third transistor has a control electrode connected to the second clock signal end, a first electrode connected to the third node, and a second electrode connected to the fourth node;
    the third capacitor has a first electrode connected to the second power supply end, and a second electrode connected to the fourth node; and
    the fourth transistor has a control electrode connected to the first node, a second electrode connected to the second power supply end, and a first electrode connected to the fourth node.

5. The shift register according to claim 1, wherein the second control unit comprises a fifth transistor and a sixth transistor,
    the fifth transistor has a control electrode connected to the second node, a first electrode connected to a second signal end, and a second electrode connected to a sixth node; and the sixth transistor has a control electrode connected to the second clock signal end, a first electrode connected to the sixth node, and a second electrode connected to the first node.

6. The shift register according to claim 1, wherein the input unit comprises a seventh transistor, an eighth transistor, and a ninth transistor,
wherein the seventh transistor has a control electrode connected to the first clock signal end, a first electrode connected to the signal input end, and a second electrode connected to the first node;
the eighth transistor has a control electrode connected to the first clock signal end, a first electrode connected to the first power supply end, and a second electrode connected to the second node; and
the ninth transistor has a control electrode connected to the first node, a first electrode connected to the first clock signal end, and a second electrode connected to the second node.

7. The shift register according to claim 1, wherein the output unit comprises a tenth transistor and an eleventh transistor,
the tenth transistor has a control electrode connected to the fifth node, a first electrode connected to the first power supply end, and a second electrode connected to the output end; and
the eleventh transistor has a control electrode connected to the fourth node, a first electrode connected to the second power supply end, and a second electrode connected to the output end.

8. The shift register according to claim 1, wherein the input unit includes a seventh transistor, an eighth transistor, and a ninth transistor, the first control unit comprises a second transistor, a third transistor, a fourth transistor, a second capacitor, and a third capacitor, the second control unit comprises a fifth transistor and a sixth transistor, the output unit comprises a tenth transistor and an eleventh transistor, the voltage stabilizing unit comprises a first transistor and a first capacitor, and the output unit comprises a tenth transistor and an eleventh transistor,
wherein the seventh transistor has a control electrode connected to the first clock signal end, a first electrode connected to the signal input end, and a second electrode connected to the first node;
the eighth transistor has a control electrode connected to the first clock signal end, a first electrode connected to the first power supply end, and a second electrode connected to the second node;
the ninth transistor has a control electrode connected to the first node, a first electrode connected to the first clock signal end, and a second electrode connected to the second node;
the second transistor has a control electrode connected to the second node, a first electrode connected to the second clock signal end, and a second electrode connected to a third node;
the second capacitor has a first electrode connected to the second node, and a second electrode connected to the third node;
the third transistor has a control electrode connected to the second clock signal end, a first electrode connected to the third node, and a second electrode connected to the fourth node;
the third capacitor has a first electrode connected to the second power supply end, and a second electrode connected to the fourth node;
the fourth transistor has a control electrode connected to the first node, a second electrode connected to the second power supply end, and a first electrode connected to the fourth node;
the fifth transistor has a control electrode connected to the second node, a first electrode connected to the second signal end, and a second electrode connected to a sixth node;
the sixth transistor has a control electrode connected to the second clock signal end, a first electrode connected to the sixth node, and a second electrode connected to the first node;
the tenth transistor has a control electrode connected to the fifth node, a first electrode connected to the first power supply end, and a second electrode connected to the output end;
the eleventh transistor has a control electrode connected to the fourth node, a first electrode connected to the second power supply end, and a second electrode connected to the output end;
the first transistor has a control electrode connected to the first power supply end, a first electrode connected to the first node, and a second electrode connected to the fifth node; and
the first capacitor has a first electrode connected to the first node, and a second electrode connected to the output end.

9. A drive circuit, comprising: multiple cascaded shift registers according to claim 1,
wherein a signal input end of a first-stage shift register is connected to an enable signal line, a signal input end of a $n^{th}$-stage shift register is connected to an output end of an $n-1^{th}$-stage shift register, a first power supply end and a second power supply end of each of the shift registers are respectively connected to a first power supply line and a second power supply line, a first clock signal end and a second clock signal end of each odd-stage shift register are respectively connected to a first clock signal line and a second clock signal line, and a first clock signal end and a second clock signal end ECB of each even-stage shift register are respectively connected to the second clock signal line and the first clock signal line, wherein n is a positive integer greater than or equal to 2.

10. A display substrate, comprising: a display region and a bezel region located at a periphery of the display region, wherein the display substrate comprises the drive circuit according to claim 9, the drive circuit is located in the bezel region, and in the bezel region, the display substrate comprises:
a base substrate;
an oxide semiconductor layer, located on a side of the base substrate and comprising a first active layer of a first transistor;
a first insulating layer, located on a side of the oxide semiconductor layer facing away from the base substrate;
a first metal layer, located on a side of the first insulating layer facing away from the base substrate and comprising a first gate electrode of the first transistor and a first plate;
a second insulating layer, located on a side of the first metal layer facing away from the base substrate;
a second metal layer, located on a side of the second insulating layer facing away from the base substrate and comprising a second plate, wherein an orthographic projection of the second plate on the base substrate is within a range of an orthographic projection of the first plate on the base substrate, and the second plate and the first plate form a first capacitor;
a third insulating layer, located on a side of the second metal layer facing away from the base substrate, and provided with a first via hole and a second via hole for exposing the first active layer, a fourth via hole for exposing the first plate, and a fifth via hole for exposing the second plate; and
a third metal layer, located on a side of the third insulating layer facing away from the base substrate and comprising an eighth metal strip and an eleventh drain electrode, wherein the eighth metal strip is connected to the first active layer through the second via hole and connected to the first plate through the fourth via hole, and the eleventh drain electrode is connected to the second plate through the fifth via hole.

11. The display substrate according to claim 10, wherein the oxide semiconductor layer further comprises a fourth active layer of a fourth transistor, the first metal layer further comprises a tenth gate electrode of a tenth transistor and a fourth gate electrode of the fourth transistor, the fourth gate electrode and the first plate are of an integral structure, the third insulating layer is further provided with a thirty-seventh via hole for exposing the tenth gate electrode, the third metal layer further comprises a seventh metal strip, the seventh metal strip is connected to the tenth gate electrode through the thirty-seventh via hole, and the seventh metal strip is connected to the first active layer through the first via hole.

12. The display substrate according to claim 10,
wherein the oxide semiconductor layer further comprises a second active layer of a second transistor, a third active layer of a third transistor, a fourth active layer of a fourth transistor, a fifth active layer of a fifth transistor, a sixth active layer of a sixth transistor, a seventh active layer of a seventh transistor, an eighth active layer of an eighth transistor, a ninth active layer of a ninth transistor, a tenth active layer of a tenth transistor, and an eleventh active layer of an eleventh transistor, the tenth active layer and the eleventh active layer are of an integral structure, the tenth active layer is arranged in a first direction, the first active layer, the second active layer, the third active layer, the fourth active layer, the fifth active layer, the sixth active layer, the seventh active layer, the eighth active layer, and the ninth active layer are all located on a side of the tenth active layer away from the display region, the fifth active layer and the sixth active layer are of an integral structure, the first active layer, the second active layer, the third active layer, the fifth active layer, the sixth active layer, the seventh active layer, the eighth active layer, and the ninth active layers are all arranged in the first direction, and the first direction is parallel to an extending direction of the bezel region; and
the third metal layer further comprises an enable signal line, a second clock signal line, a first clock signal line, a second power supply line, and a first power supply line, wherein the enable signal line, the second clock signal line, the first clock signal line, and the second power supply line are all arranged in the first direction, the enable signal line, the second clock signal line, the first clock signal line, and the second power supply line are successively closer to the display region, and are all located on a side of the oxide semiconductor layer facing away from the display region, and the first power supply line is located on a side of the oxide semiconductor layer facing the display region.

13. A display device, comprising the display substrate according to claim 10.

14. A display device, comprising the drive circuit according to claim 9.

15. A drive method of a shift register, applied to the shift register according to claim 1, the method comprising:
a first stage: providing a signal of a signal input end to a first node, transmitting the signal of the first node to a fifth node through a first transistor, turning off a tenth transistor, turning off a third transistor, floating a fourth node, and keeping an output end to output a signal of a first power supply end under action of a first capacitor;
a second stage: providing a signal of a second power supply end to the first node, transmitting the signal of the first node to the fifth node, turning off the tenth transistor, turning on both a second transistor and the third transistor, providing a signal of a second clock signal end to the fourth node, turning on an eleventh transistor, and providing the signal of the second power supply end to the output end;
a third stage: providing the signal of a signal input end to the first node, transmitting the signal of the first node to the fifth node, turning off the tenth transistor, turning off both the third transistor and a fourth transistor, floating the fourth node to keep the state of the second stage, turning on the eleventh transistor, and providing the signal of the second power supply end to the output end;
a fourth stage: providing the signal of the second power supply end to the first node, transmitting the signal of the first node to the fifth node, turning off the tenth transistor, turning on both the second transistor and the third transistor, providing the signal of the second clock signal end to the fourth node, turning on the eleventh transistor, and providing the signal of the second power supply end to the output end; and
a fifth stage: providing the signal of the signal input end to the first node, turning on the fourth transistor, providing the signal of the second power supply end to the fourth node, turning off the eleventh transistor, transmitting the signal of the first node to the fifth node, turning on the tenth transistor, and providing the signal of the first power supply end to the output end.

16. The drive method according to claim 15, further comprising:
a sixth stage: continuously outputting the signal of the first power supply end by the output end.

17. The drive method according to claim 15, wherein the first clock signal end and the second clock signal end are continuously switched between a high level and a low level respectively, and one of the first clock signal end and the second clock signal end, which has an ascending level, is changed first.

* * * * *